(12) United States Patent  
Tresness

(10) Patent No.: US 8,395,875 B2
(45) Date of Patent: Mar. 12, 2013

(54) SPARK GAP APPARATUS

(76) Inventor: Andrew F. Tresness, Manlius, NY (US)

( * ) Notice: Subject to any disclaimer, the term of this patent is extended or adjusted under 35 U.S.C. 154(b) by 135 days.

(21) Appl. No.: 12/856,276

(22) Filed: Aug. 13, 2010

(65) Prior Publication Data
US 2012/0039010 A1 Feb. 16, 2012

(51) Int. Cl.
H02H 1/00 (2006.01)

(52) U.S. Cl. ........................ 361/117; 361/120

(58) Field of Classification Search .......... 361/117–120, 361/127, 212, 220
See application file for complete search history.

(56) References Cited

U.S. PATENT DOCUMENTS

| 2,922,913 | A |   | 1/1960  | Cushman |
|-----------|---|---|---------|---------|
| 4,160,210 | A |   | 7/1979  | Molinari |
| 4,322,777 | A | * | 3/1982  | Ueta et al. ............... 361/748 |
| 4,409,637 | A |   | 10/1983 | Block |
| 4,544,577 | A | * | 10/1985 | May ....................... 427/555 |
| 4,586,105 | A |   | 4/1986  | Lippmann et al. |
| 4,620,126 | A |   | 10/1986 | Manske |
| 4,633,359 | A |   | 12/1986 | Mickelson et al. |
| 4,701,725 | A |   | 10/1987 | Dorsey |
| 5,142,434 | A |   | 8/1992  | Boy et al. |
| 5,495,383 | A |   | 2/1996  | Yoshioka et al. |
| 5,508,873 | A |   | 4/1996  | Knapp et al. |
| 5,566,056 | A |   | 10/1996 | Chaudhry |
| 5,674,083 | A |   | 10/1997 | Whiteman, Jr. et al. |
| 5,714,794 | A |   | 2/1998  | Tsuyama et al. |
| 5,754,385 | A |   | 5/1998  | Altmaier et al. |
| 5,933,307 | A |   | 8/1999  | West |
| 5,969,924 | A |   | 10/1999 | Noble |
| 6,059,983 | A |   | 5/2000  | Noble |
| 6,172,590 | B1 |  | 1/2001  | Shrier et al. |
| 6,215,251 | B1 |  | 4/2001  | Orchard-Webb |
| 6,266,223 | B1 |  | 7/2001  | Curry |
| 6,285,535 | B1 |  | 9/2001  | Nakamura |
| 6,298,134 | B1 |  | 10/2001 | Curry |
| 6,510,034 | B2 |  | 1/2003  | Palinkas et al. |
| 6,560,087 | B1 |  | 5/2003  | Zennamo, Jr. et al. |
| 6,600,642 | B1 |  | 7/2003  | Karnes |
| 6,628,498 | B2 |  | 9/2003  | Whitney et al. |
| 6,683,773 | B2 |  | 1/2004  | Montena |
| 6,859,351 | B2 |  | 2/2005  | Byrne et al. |
| 6,930,872 | B2 |  | 8/2005  | Palinkas et al. |
| 7,102,868 | B2 |  | 9/2006  | Montena |

(Continued)

FOREIGN PATENT DOCUMENTS
GB 2053579 A1 2/1981

Primary Examiner — Danny Nguyen
(74) Attorney, Agent, or Firm — Lawrence P. Trapani, Esq.

(57) ABSTRACT

A spark gap for protecting electronic circuits from excessive electrical surges comprises a substrate containing an opening, a dielectric medium occupying the opening, and first and second electrodes. The first electrode is embedded in the substrate, on one side of the opening, and has a first conductive surface that extends through the substrate and is substantially exposed in the opening and to the dielectric medium. The second electrode is embedded in the substrate, on another side of the opening, and has a second conductive surface that extends through the substrate and is substantially exposed in the opening and to the dielectric medium. The first conductive surface is in opposing relation to the second conductive surface, and they are spaced apart by a predetermined distance to establish a gap width. An electrical arc is generated across the opening when a voltage potential difference between the conductive surfaces exceeds a threshold value.

64 Claims, 11 Drawing Sheets

U.S. PATENT DOCUMENTS

| | | |
|---|---|---|
| 7,126,804 B1 | 10/2006 | James et al. |
| 7,161,784 B2 | 1/2007 | Cheung et al. |
| 7,161,785 B2 | 1/2007 | Chawago |
| 7,369,388 B2 | 5/2008 | Cheung et al. |
| 7,420,794 B2 | 9/2008 | Olcen |
| 7,495,880 B2 | 2/2009 | Makino et al. |
| 7,561,398 B2 | 7/2009 | Hung |
| 7,821,359 B2 | 10/2010 | Hart |
| 7,894,172 B2 * | 2/2011 | Pan et al. ............... 361/56 |
| 2001/0000985 A1 | 5/2001 | Kobsa |
| 2006/0023386 A1 | 2/2006 | Palinkas et al. |
| 2006/0152334 A1 * | 7/2006 | Maercklein et al. ......... 338/210 |
| 2008/0302468 A1 | 12/2008 | Sidhu |
| 2010/0265625 A1 | 10/2010 | Montena |

* cited by examiner

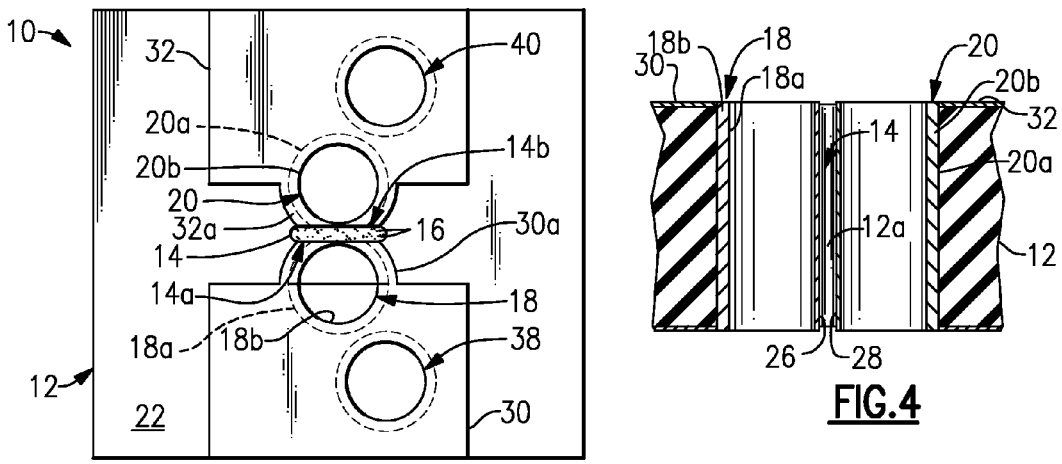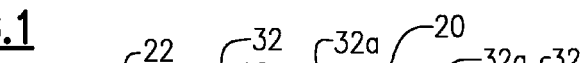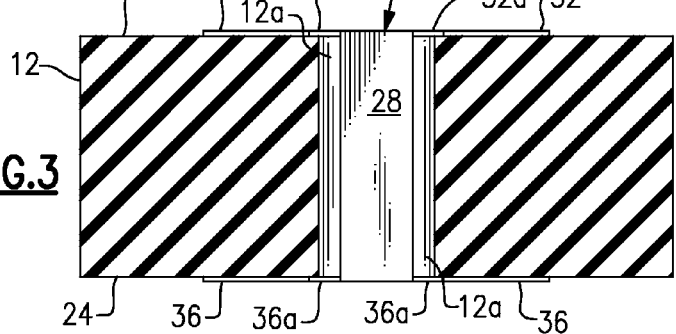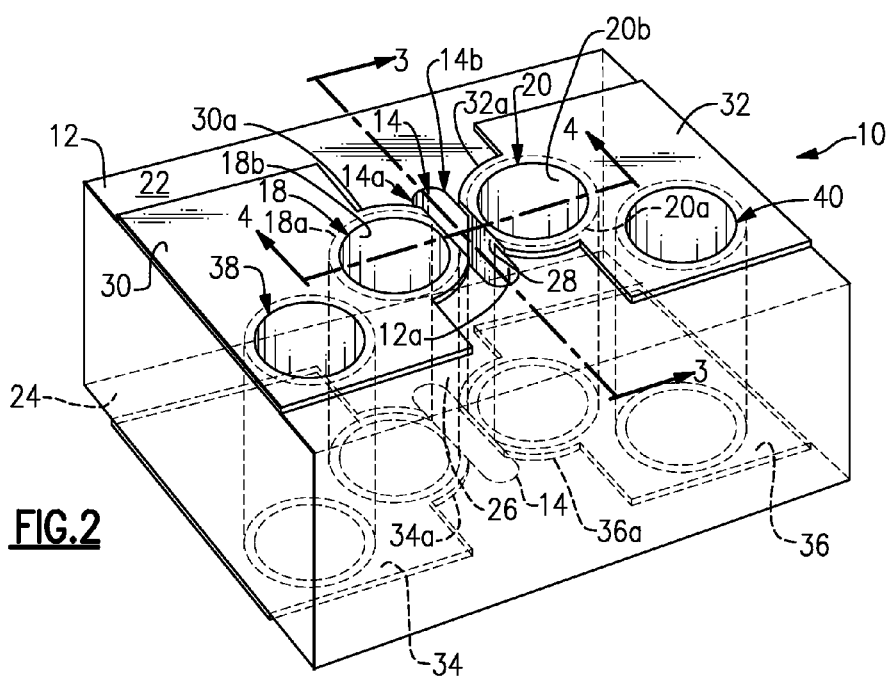

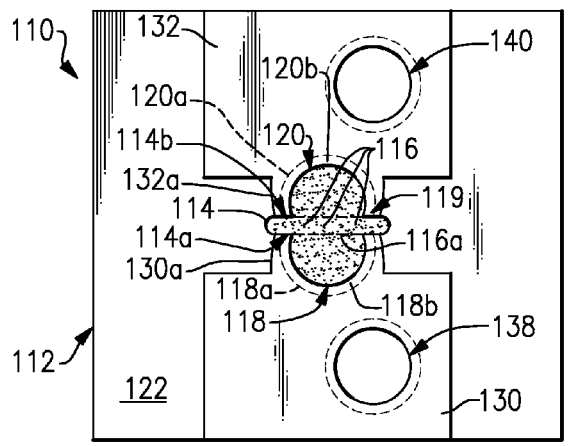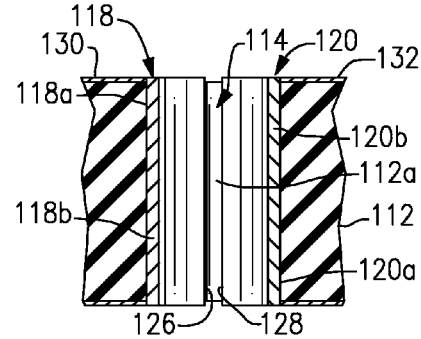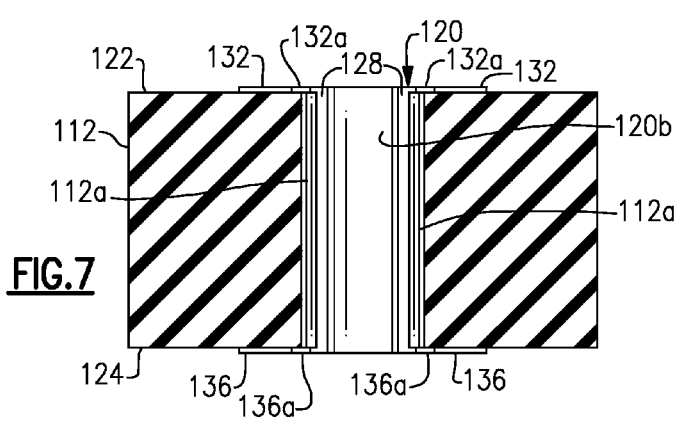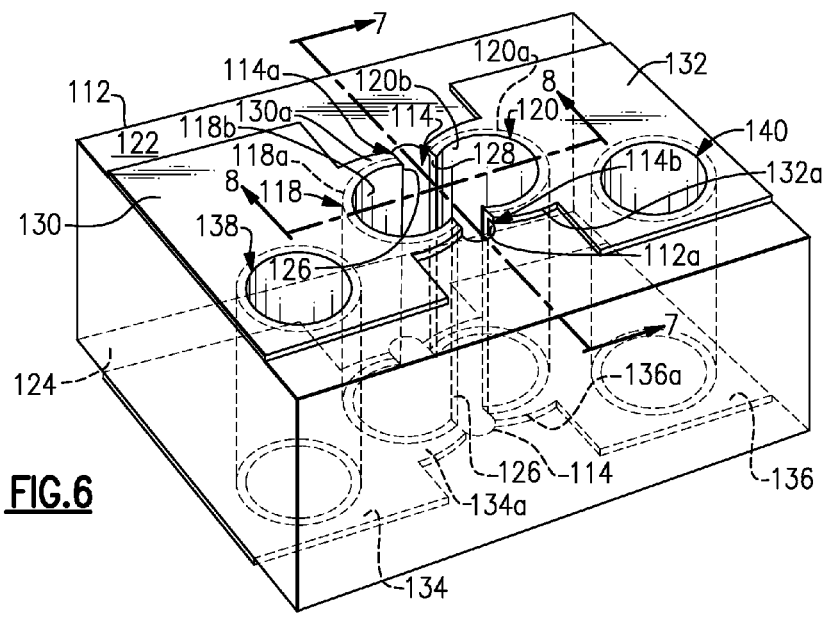

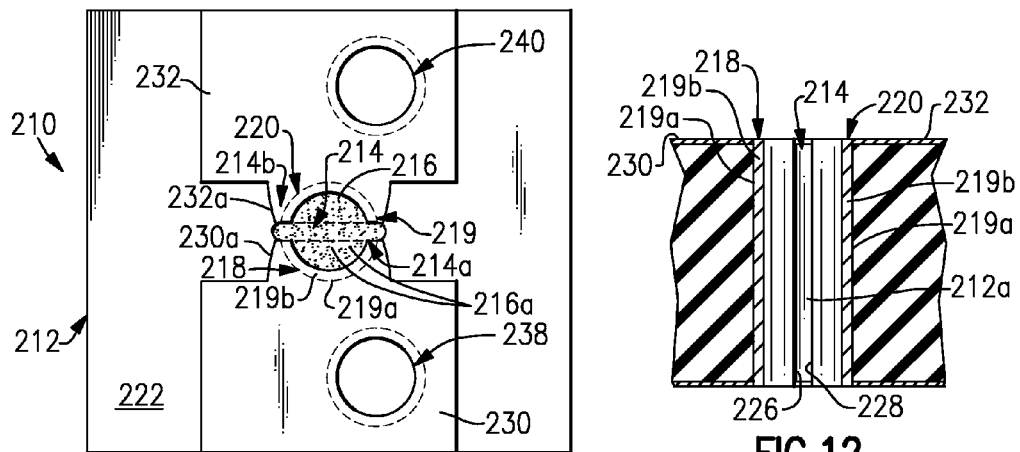
FIG. 9
FIG. 12
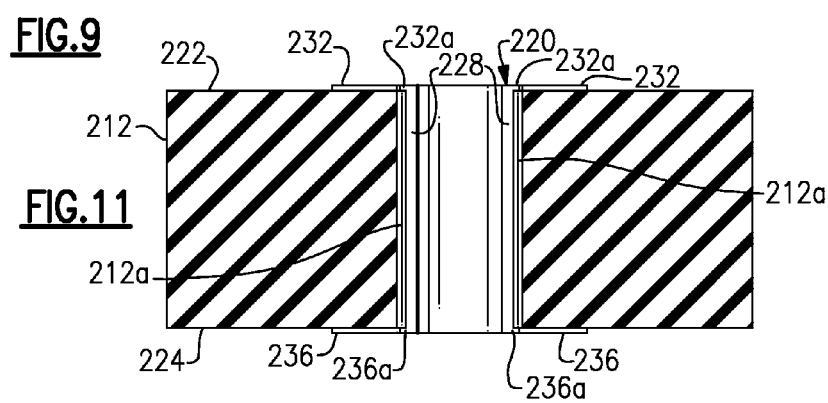
FIG. 11
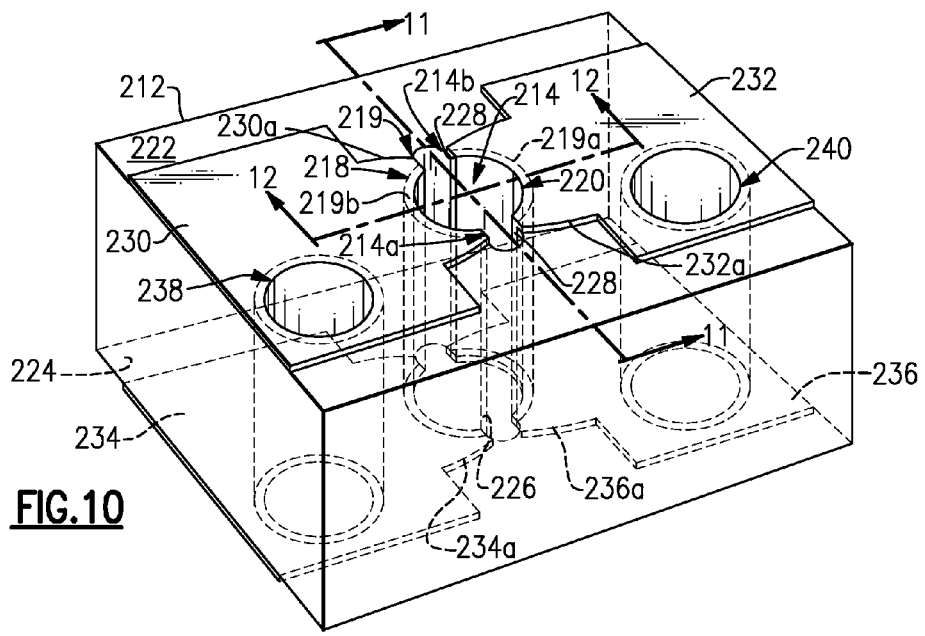
FIG. 10

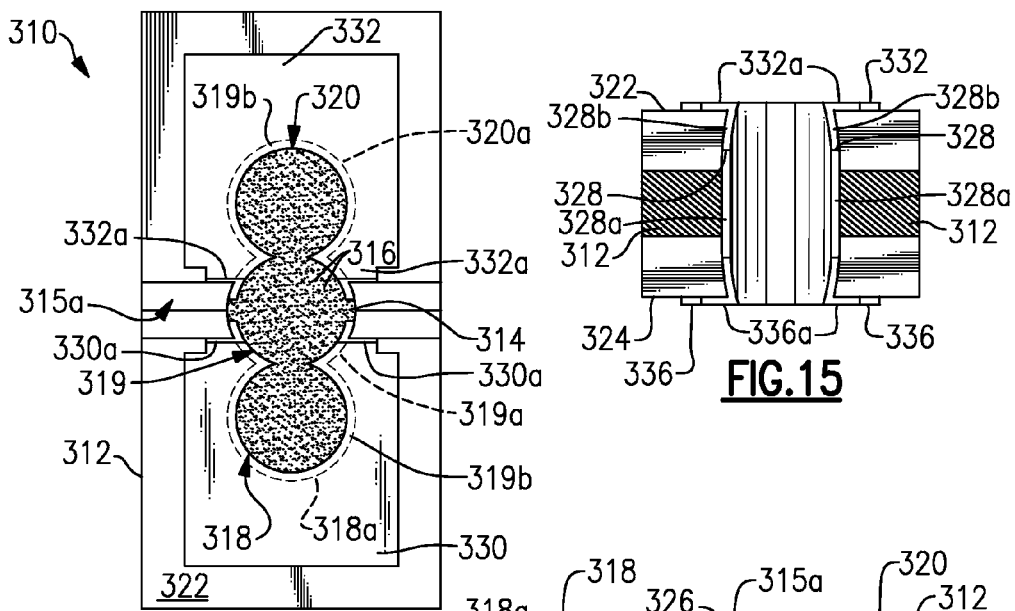
FIG.13
FIG.15
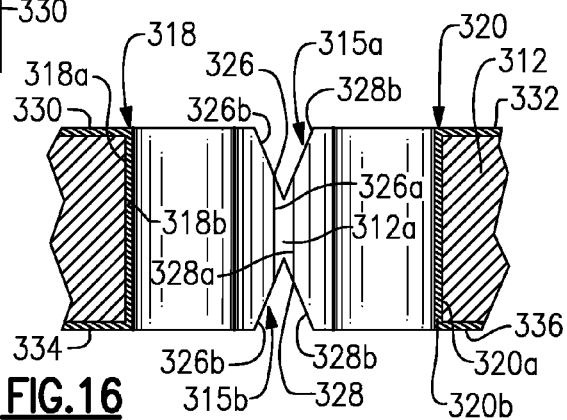
FIG.16
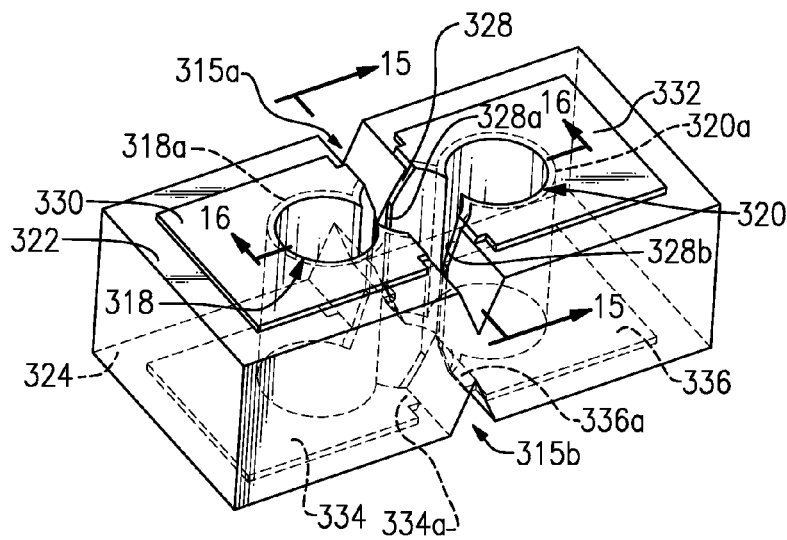
FIG.14

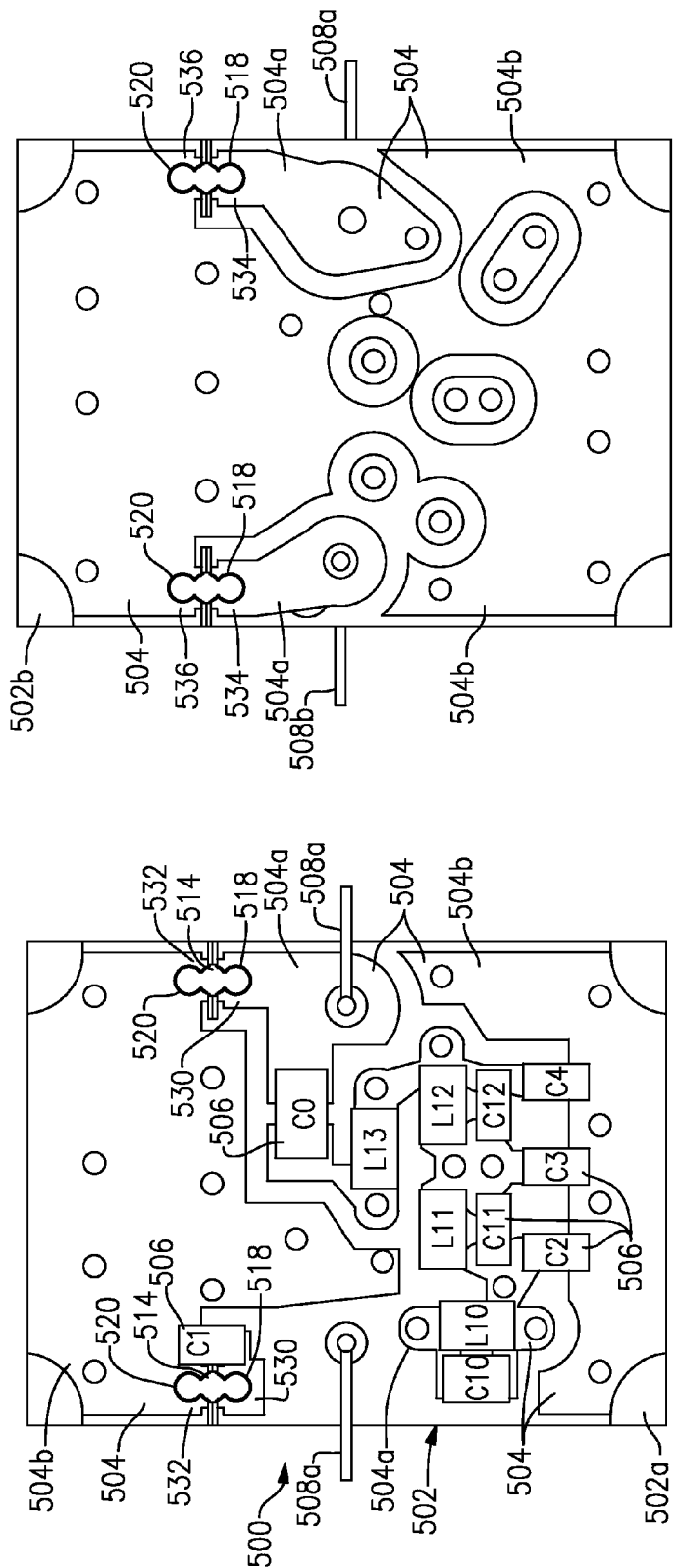
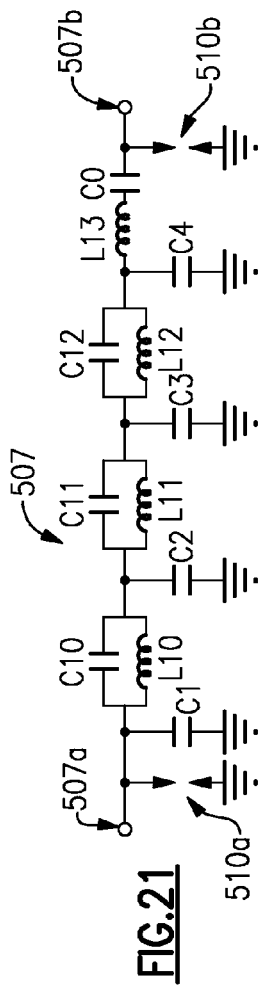
FIG.20
FIG.19
FIG.21

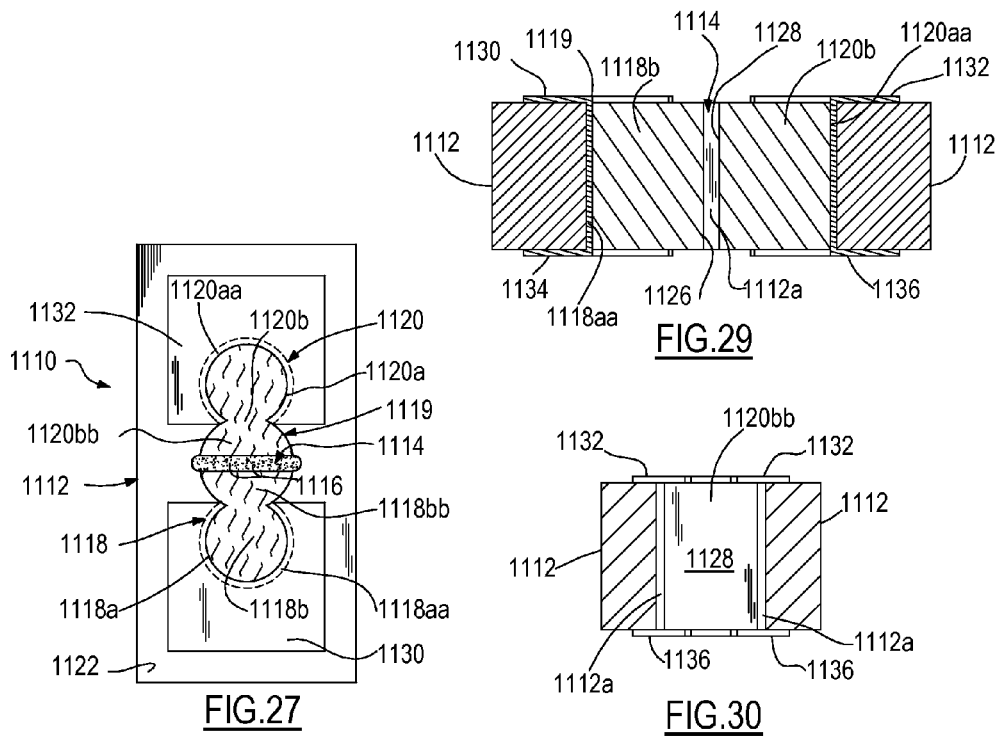
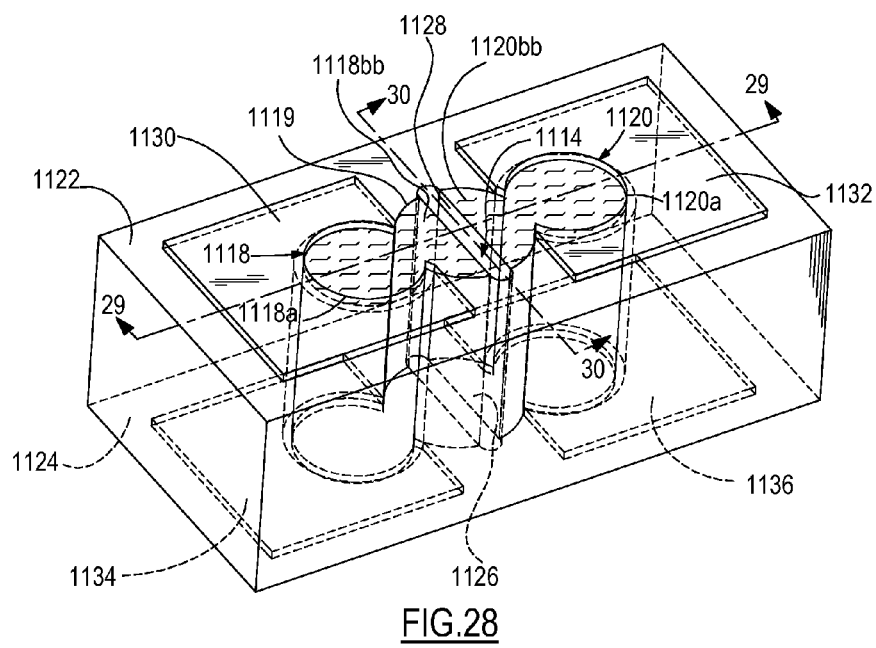

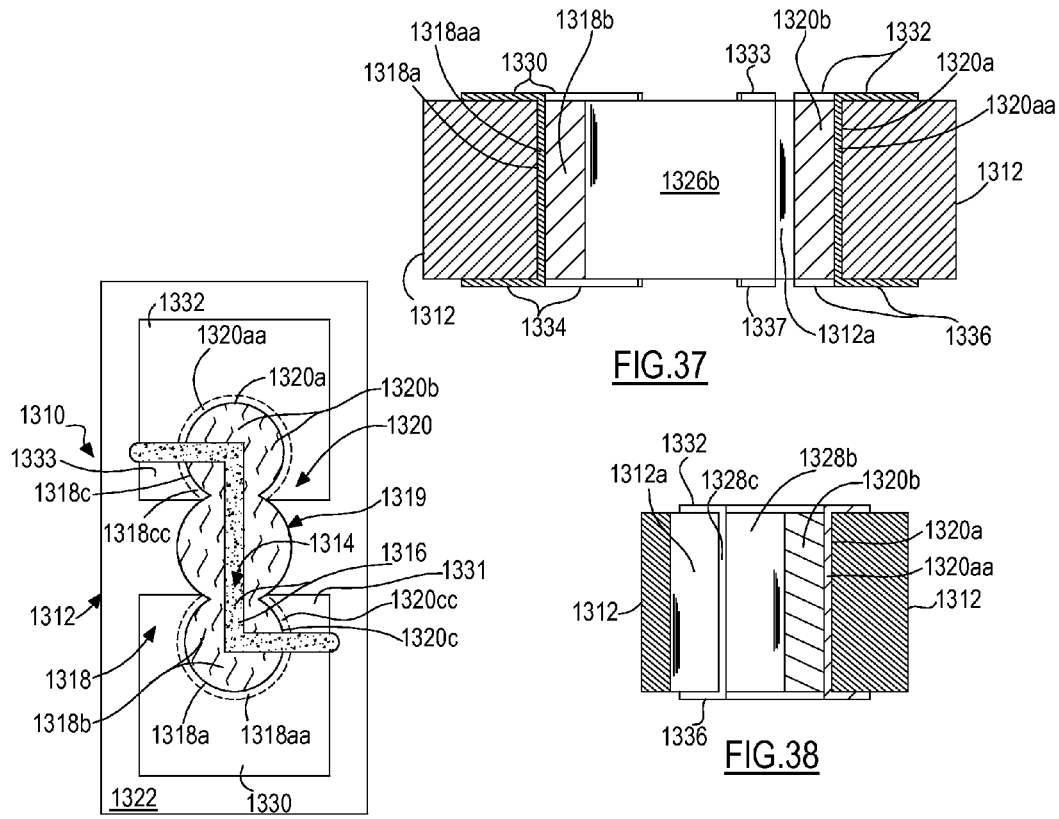
FIG.37
FIG.38
FIG.35
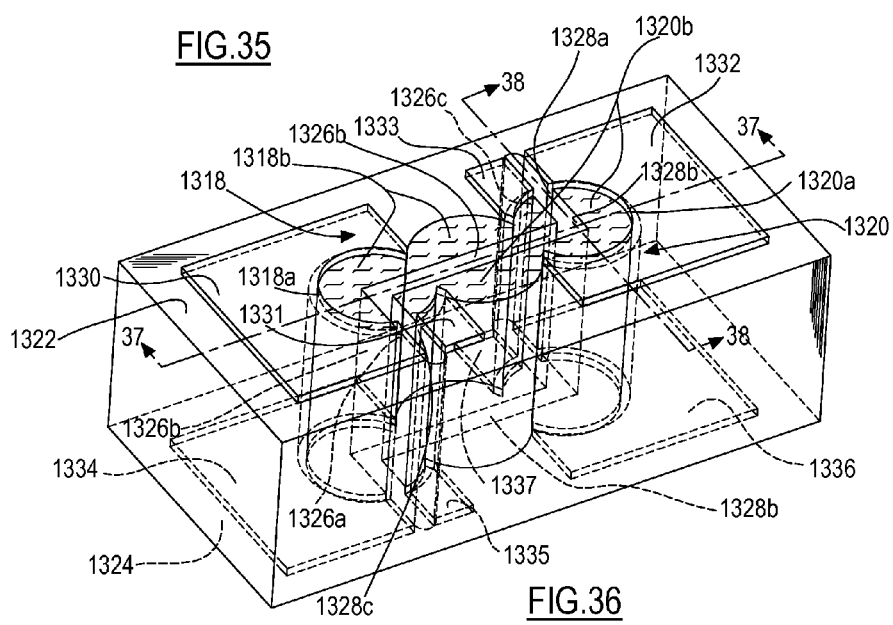
FIG.36

SPARK GAP APPARATUS

BACKGROUND OF THE INVENTION

1. Field of Invention

The present invention relates generally to devices for protecting electronic circuits from excessive electrical surges, and more particularly to spark gaps implemented in conjunction with substrates such as, for example, printed circuit boards.

2. Background Art

A spark gap is a device that protects electrical systems and circuits from voltages that exceed the limits designed for such systems and circuits. This is referred to as "overvoltage" protection. Excessive voltages may be caused by lightning strikes, electric power transients or spikes, and electrostatic discharges. A spark gap accomplishes overvoltage protection by employing a gap containing a dielectric medium (e.g., air) between two electrically isolated conductors. The gap has a predefined width for maintaining electrical isolation until a threshold voltage differential develops between the two conductors. Upon reaching this threshold (or "breakdown voltage"), the dielectric strength of the gap's dielectric medium is exceeded, producing an arc and a discharge current across the gap. This causes the voltage differential between the conductors to decrease until the current extinguishes and the voltage differential drops below the threshold, at which time, the two conductors again become electrically isolated. Effectively, the spark gap limits the level of the voltage differential between the conductors. Typically, one of the conductors is at ground potential, and the discharge current flows to ground. The threshold or breakdown voltage is determined by the width of the gap and the dielectric strength of the dielectric medium in the gap.

For some time now, spark gaps have been employed on or in connection with printed circuit (PC) boards to provide overvoltage protection for delicate electronic circuitry mounted on the boards. Generally, such spark gaps ("PC board spark gaps") are connected between a signal path and a ground path. The signal path may carry either information signals or power signals, or both. Typically, the PC board spark gap takes the form of opposing, space apart, conductive traces or sets of traces etched or deposited on the surface of the PC board. One of the traces or sets of traces is connected to the signal path and the other one of the traces or sets of traces is connected to the ground path. Examples of such PC board spark gaps are disclosed in the following patents: U.S. Pat. No. 7,126,804 to James et al.; U.S. Pat. No. 6,930,872 to Palinkas et al.; U.S. Pat. No. 6,600,642 to Karnes; U.S. Pat. No. 6,510,034 to Palinkas et al.; U.S. Pat. No. 6,059,983 to Noble; U.S. Pat. No. 5,969,924 to Noble; and UK Patent 2,053,579 to Griffiths et al.

PC board spark gaps that have a gap defined by conductive traces etched or deposited on the surface of the PC board have several drawbacks. First, the traces tend to degrade at the gap, due to vaporization caused by the energy from the arc discharges. The result is that the gap becomes wider, causing the threshold or breakdown voltage to increase. If the threshold increases too much, then the spark gap will not protect the circuitry on the PC board. In some cases, vaporization of the traces may leave behind carbon tracks on the surface of the board, which could cause sustained arcing or undesirable leakage currents. Second, in an effort to make PC board spark gaps more durable, the traces or trace features have been enlarged or multiplied (redundancy). This strategy necessarily requires greater surface area on the boards, leaving less area for the circuitry. Third, the precision of the gap width (and therefore the voltage threshold) is dependent upon, and thus limited by, PC board etching tolerances and errors.

Attempts have been made to overcome the degradation of printed circuit traces of PC board spark gaps. For instance, the traces have been made thicker and slots have been cut into or through the PC board below the gap; see, e.g., the Background discussion in U.S. Pat. No. 5,933,307 to West. West further proposes to use the conductive ends of surface mount devices (such as jumper or resistor SMDs) to establish the gap above the surface of the PC board. West also discloses a slot through the board, below the gap (see West FIGS. 5A & 5B). Similarly, U.S. Pat. No. 4,322,777 to Ueta et al. proposes to use copper balls soldered to opposing traces to establish the gap and protect the traces from vaporization (see, e.g., FIG. 2B, 4B, 5B, 6B, 7B, 8B, 9B, 10B, 11B, & 12B). Ueta et al. also discloses the use of slots into and through the PC board below the spark gap (see, e.g., FIGS. 4A, 4B, 6A & 6B). While these approaches may have met with some success, they require the mounting of additional parts on the board. In addition, they require solder joints to hold the parts in place on the conductive traces, which may raise a concern about the reliability of the joints after experiencing one or more arc discharges.

Another approach to the problem of creating a durable spark gap is to utilize features of the PC board other than the conductive traces. One such feature is the plated-through hole or via, i.e., a plated hole which extends through the PC board and is usually in electrical contact with conductive traces on one or both mounting surfaces of the PC board. In one type of embodiment, the plated-through hole functions directly as one of the electrodes of the spark gap. See, for example, the following patents: U.S. Pat. No. 6,560,087 to Zennamo, Jr. et al. (FIG. 5); and U.S. Pat. No. 4,160,210 to Molinari (FIG. 2). In these examples, the spark gap is implemented above the surface of the PC board. In another type of embodiment, the plated-through hole operates as a conductor to connect a spark gap electrode (on one surface of the board) to a ground contact (on the other surface of the board). See, for example, the following patents: U.S. Pat. No. 6,628,498 to Whitney et al. (FIG. 12); U.S. Pat. No. 6,285,535 to Nakamura (FIG. 3); and U.S. Pat. No. 6,172,590 to Shrier et al. (FIGS. 11-17). In Nakamura, an alumina (i.e., aluminum oxide) substrate is used and the plated-through hole is filled with a conductor. Shrier et al. also suggests an aluminum oxide substrate. Whitney et al. suggests that plated-through holes (vias) may be filled with plating material and that such holes may function as heat pipes or heat sinks In a further type of embodiment, the spark gap electrodes are wires placed across the surface of an aluminum oxide substrate and anchored in holes that are surrounded by metalized areas. See, e.g., U.S. Pat. No. 4,620,126 to Manske (FIG. 1). In these various embodiments, the concept of employing a plated-through hole or holes to define the gap of a spark gap (and advantages flowing from that) have been overlooked.

An effort to implement a spark gap using two plated-through holes embedded in a substrate is disclosed in the following patents: U.S. Pat. No. 5,714,794 to Tsuyama et al. and U.S. Pat. No. 7,161,784 to Cheung et al. In the Tsuyama et al. embodiments, etched traces (150), connected to the plated-through holes, establish the gaps of the spark gaps (see, e.g., FIGS. 15(a)-15(g)). In Cheung et al., multi-layered PC boards have spark gaps implemented with conductive traces and plated-through holes or cores (see FIGS. 9-11, & 13; cols. 4-5). Like Tsuyama et al., the conductive traces in Cheung et al. establish the gap of the spark gap, rather than the plated-through holes. In Cheung et al., the traces may be on the same surface (as in FIG. 9) or on different (overlapping)

surfaces (as in FIGS. 11 & 13). Again, the concept and advantages of employing plated-through holes to establish the gap of a spark gap are not disclosed.

Spark gaps have been used to protect electronic filter circuits mounted on PC boards, such as those disclosed in the following U.S. patents: U.S. Pat. No. 7,126,804 to James et al.; U.S. Pat. No. 6,930,872 to Palinkas et al.; U.S. Pat. No. 6,560,087 to Zennamo, Jr. et al.; and U.S. Pat. No. 6,510,034 to Palinkas et al. These patents were previously cited and discussed above.

OBJECTS AND SUMMARY OF THE INVENTION

It is therefore an object of the present invention to provide a spark gap apparatus that overcomes the problems and limitations of the prior art.

It is another object of the present invention to provide a spark gap apparatus that is capable of undergoing multiple arc discharges without substantial degradation and maintaining a desired threshold or breakdown voltage.

It is a further object of the present invention to provide a spark gap apparatus with improved capacity to dissipate electrical and thermal energy generated by the arc discharges.

It is still another object of the present invention to provide a spark gap apparatus that occupies a minimal amount of space on the surfaces of a substrate or PC board.

It is still a further object of the present invention to provide a spark gap apparatus that does not require components mounted to a substrate or PC board to define the gap.

It is yet another object of the present invention to provide a spark gap apparatus where the precision of the gap width (and therefore the voltage threshold) is substantially independent of and thus not limited by PC board etching tolerances and errors.

It is yet a further object of the present invention to provide a spark gap apparatus that can be implemented by known PC board fabrication techniques.

These and other objects are attained in accordance with the present invention wherein there is provided a spark gap apparatus for protecting electronic circuits from excessive electrical surges. In one embodiment, the spark gap apparatus comprises a substrate containing an opening, a dielectric medium occupying the opening, and first and second spark gap electrodes. The opening extends at least partially through the substrate and is defined by first and second opposing sides. The dielectric medium may be, for example, air, or it could be a solid dielectric material such as, for example, alumina. The first electrode is substantially embedded in the substrate on the first side of the opening, and the second electrode is substantially embedded in the substrate on the second side of the opening. The first and second electrodes have first and second conductive surfaces, respectively, that extend at least partially through the substrate and are substantially exposed in the opening and to the dielectric medium. The first conductive surface is in opposing relation to the second conductive surface, and they are spaced apart by a predetermined distance to establish a gap. An electrical arc is generated across the gap when an electric potential exceeding a threshold value develops between the conductive surfaces.

Another embodiment of the present invention involves a PC board. In accordance with this embodiment, a PC board comprises a substrate, a plurality of conductive traces on the substrate, and first and second spark gap electrodes. The substrate includes first and second mounting surfaces. The plurality of conductive traces are either etched or printed on one or both of the mounting surfaces of the substrate. The plurality of conductive traces includes a signal trace and a ground trace. The first and second electrodes are substantially embedded in the substrate and have first and second conductive surfaces, respectively, that extend at least partially through the substrate. In one application of this embodiment, the first electrode is in electrical communication with the signal trace and the second electrode is in electrical communication with the ground trace. The first conductive surface is in opposing relation with the second conductive surface, and they are spaced apart by a predetermined distance to form a gap. An electrical arc is generated across the gap when an electric potential exceeding a threshold value develops between the conductive surfaces.

A further embodiment of the present invention involves a filter circuit. In accordance with this embodiment, an electronic filter with electric surge protection is provided. The electronic filter comprises a PC board, a plurality of electronic components, an input and an output conductor, and first and second spark gap electrodes. The PC board has first and second mounting surfaces and a plurality of conductive traces. Among the conductive traces are a signal trace and a ground trace. The PC board contains an opening proximate to the signal trace and ground trace. The opening extends at least partially through the PC board from one mounting surface toward the other mounting surface. The opening is defined by first and second opposing sides and contains a dielectric medium. The electronic components are mounted to at least some of the conductive traces and are electrically coupled together to form an electronic filter circuit. The filter circuit is in electrical communication with the signal trace and ground trace. The input and output conductors are mounted to the PC board and are in electrical communication with the filter circuit, such that the input conductor is able to deliver a signal (to be filtered) to the filter circuit and the output conductor is able to carry away a signal filtered by the filter circuit. The first electrode is in electrical communication with the signal trace and substantially embedded in the PC board on the first side of the opening. The second electrode is in electrical communication with the ground trace and substantially embedded in the PC board on the second side of the opening. The first and second electrodes have first and second conductive surfaces, respectively, that extend at least partially through the PC board. The first and second conductive surfaces are at least partially exposed in the opening and to the dielectric medium. The first conductive surface is in opposing relation with the second conductive surface, and they are spaced apart by a predetermined distance to form a gap. An electrical arc is generated across the gap when an electric potential exceeding a threshold value develops between the conductive surfaces.

In the above-described embodiments, it is preferred that the spark gap electrodes be implemented as plated-through holes or electrically isolated sections of a plated-through hole. The plated-through holes or sections preferably extend completely through the substrate or PC board. There may be an annular conductive trace surrounding at least a portion of each plated-through hole or section, at one or both mounting surfaces of the substrate or PC board. In one embodiment, these annular traces may be connected to other printed circuit traces, such as a signal trace or a ground trace, or may be connected to an input or output conductor. In the context of the present invention, a "signal trace" is a trace that carries either information signals or power signals, or both, or may contain other types of signals, but is not at ground potential.

In many cases, it is contemplated that an opening be contained in the substrate or PC board, between the plated-through holes or sections, and that the opening extend completely through the substrate or PC board. The opening may remain empty so that an air gap can be established or be filled with a solid dielectric such as alumina. The opening may be dispensed with if the substrate (or PC board) itself has the desired dielectric properties for the spark gap. For example, alumina or an alumina ceramic may serve as the substrate and as the dielectric medium between the spark gap electrodes. The term "gap" in this specification means a spatial separation between the spark gap electrodes and does not require, but may include, an empty space or void.

BRIEF DESCRIPTION OF THE DRAWING

Further objects of the present invention will become apparent from the following description of the preferred embodiments with reference to the accompanying drawing, in which:

FIG. 1 is a top plan view of one embodiment of the spark gap apparatus of the present invention;

FIG. 2 is a perspective view of the spark gap apparatus of FIG. 1;

FIG. 3 is a cross-sectional view of the spark gap apparatus of FIG. 1, taken along line 3-3 in FIG. 2;

FIG. 4 is a cross-sectional view of the spark gap apparatus of FIG. 1, taken along line 4-4 in FIG. 2;

FIG. 5 is a top plan view of a second embodiment of the spark gap apparatus of the present invention;

FIG. 6 is a perspective view of the spark gap apparatus of FIG. 5;

FIG. 7 is a cross-sectional view of the spark gap apparatus of FIG. 5, taken along line 7-7 in FIG. 6;

FIG. 8 is a cross-sectional view of the spark gap apparatus of FIG. 5, taken along line 8-8 in FIG. 6;

FIG. 9 is a top plan view of a third embodiment of the spark gap apparatus of the present invention;

FIG. 10 is a perspective view of the spark gap apparatus of FIG. 9;

FIG. 11 is a cross-sectional view of the spark gap apparatus of FIG. 9, taken along line 11-11 in FIG. 10;

FIG. 12 is a cross-sectional view of the spark gap apparatus of FIG. 9, taken along line 12-12 in FIG. 10;

FIG. 13 is a top plan view of a fourth embodiment of the spark gap apparatus of the present invention;

FIG. 14 is a perspective view of the spark gap apparatus of FIG. 13;

FIG. 15 is a cross-sectional view of the spark gap apparatus of FIG. 13, taken along line 15-15 in FIG. 14;

FIG. 16 is a cross-sectional view of the spark gap apparatus of FIG. 13, taken along line 16-16 in FIG. 14;

FIG. 19 is a top plan view of an exemplary embodiment of a PC board equipped with the spark gap apparatus of FIG. 13, and having an electronic filter circuit mounted thereon;

FIG. 20 is a bottom plan view of the PC board of FIG. 19;

FIG. 21 is a schematic of the electronic filter circuit mounted on the PC board of FIGS. 19 and 20;

FIG. 27 is a top plan view of a sixth embodiment of the spark gap apparatus of the present invention, employing electrically conductive fill material as part of the spark gap electrodes;

FIG. 28 is a perspective view of the spark gap apparatus of FIG. 27;

FIG. 29 is a cross-sectional view of the spark gap apparatus of FIG. 27, taken along line 29-29 in FIG. 28;

FIG. 30 is a cross-sectional view of the spark gap apparatus of FIG. 27, taken along line 30-30 in FIG. 28;

FIG. 35 is a top plan view of an eighth embodiment of the spark gap apparatus of the present invention, employing electrically conductive fill material as part of the spark gap electrodes;

FIG. 36 is a perspective view of the spark gap apparatus of FIG. 35;

FIG. 37 is a cross-sectional view of the spark gap apparatus of FIG. 35, taken along line 37-37 in FIG. 36; and FIG. 38 is a cross-sectional view of the spark gap apparatus of FIG. 35, taken along line 38-38 in FIG. 36.

DETAILED DESCRIPTION OF THE PREFERRED EMBODIMENT

Figure 17:
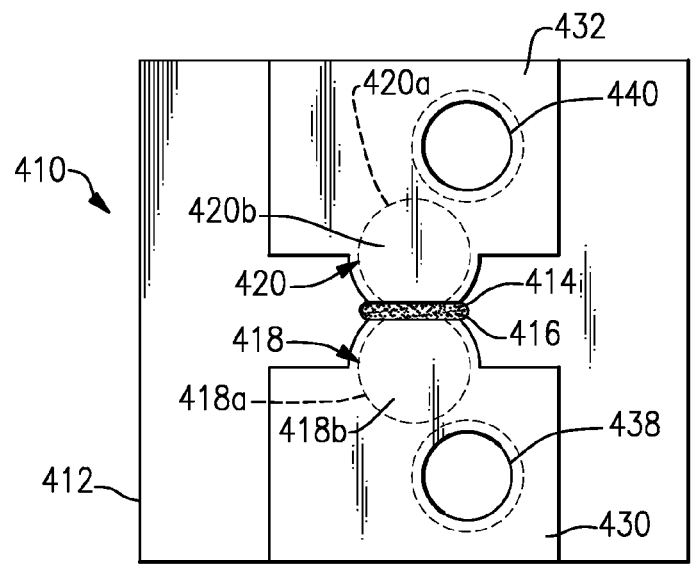
FIG. 17 is a top plan view of a fifth embodiment of the spark gap apparatus of the present invention.

A first embodiment of the spark gap apparatus of the present invention is shown in FIGS. 1-4. A spark gap apparatus 10 comprises a substrate 12 containing an opening 14, a dielectric medium 16 occupying opening 14, a first spark gap electrode 18, and a second spark gap electrode 20. Substrate 12 contains a top major surface 22 and a bottom major surface 24 (FIG. 2). Substrate 12 may be made of an epoxy fiberglass composite material such as flame-retardant grade 4 or "FR-4," or some other type of printed circuit board substrate, such as, e.g., alumina. Opening 14 extends at least partially through substrate 12. In the embodiment shown, opening 14 extends completely through substrate 12, from top surface 22 to bottom surface 24 (FIGS. 2 & 4). Opening 14 is generally defined by first and second opposing sides 14a and 14b. Electrodes 18 and 20 are embedded in substrate 12 on opposing sides 14a and 14b, respectively, of opening 14. Dielectric medium 16 is depicted in FIG. 1 by stippling. Dielectric medium 16 may be any suitable dielectric, such as, for example, air, alumina, or a combination of dielectric substances. Generally, a dielectric medium is suitable if its dielectric strength is low enough to allow arcing across a reasonably-dimensioned gap, at a breakdown voltage that will not damage the circuitry intended to be protected.

In the embodiment shown in FIGS. 1-4, electrodes 18 and 20 are implemented as plated-through holes (PTHs). PTHs 18 and 20 are produced by well-known printed circuit board fabrication techniques. Initially, a pair of holes 18a and 20a are drilled, punched, or otherwise produced, in substrate 12 and then plated through with copper or other plating material 18*b* and 20*b*, respectively. A suitable diameter for holes 18*a* and 20*a* is about 0.025 inches (or 25 mils), and a suitable thickness for plating material 18*b* and 20*b* is about 0.001 to 003 inches (or 1 to 3 mils). In one exemplary embodiment, plating material 18*b* and 20*b* has a thickness of 1 mil. PTHs 18 and 20 each have an exterior, which is generally the exterior of plating 18*b* and 20*b*, respectively. The exteriors of PTHs 18 and 20 include conductive surfaces 26 and 28, respectively, that extend through substrate 12 and are exposed in opening 14 and to dielectric medium 16. As best shown in FIGS. 2 & 4, conductive surface 26 is in opposing relation to conductive surface 28, and they are spaced apart from each other by a predetermined distance or gap width. As an example, a suitable gap width is about 5 to 7 mils if dielectric medium 16 is ambient air and the goal is to protect a circuit comprising surface mount electronic components. A 10 mil wide ambient air gap may be sufficient in some applications. As another example, a suitable gap width is about 2 mils if dielectric medium 16 is alumina (aluminum oxide).

With further reference to FIGS. 1-4, substrate 12 includes conductive traces 30 and 32 situated on mounting surface 22. Trace 30 is integrally connected to PTH 18 and is in electrical communication with conductive surface 26, and trace 32 is integrally connected to PTH 20 and is in electrical communication with conductive surface 28. Traces 30 and 32 are preferably etched from copper plating previously applied to surface 22, using well-known printed circuit board fabrication techniques. Traces 30 and 32 include annular portions 30*a* and 32*a*, respectively, which are normally produced as part of the plating process of PTHs 18 and 20 and merge with the remainder of the associated trace. Annular portions 30*a* and 32*a* are approximately 2 to 5 mils wide. A set of corresponding conductive traces 34 and 36 are situated on mounting surface 24 of substrate 12. Trace 34 is integrally connected to PTH 18 and is in electrical communication with conductive surface 26, and trace 36 is integrally connected to PTH 20 and is in electrical communication with conductive surface 28. Traces 34 and 36 are preferably etched from copper plating previously applied to surface 24. Traces 34 and 36 include annular portions 34*a* and 36*a*, respectively, as described with respect to traces 30 and 32. Annular portions 34*a* and 36*a* are approximately 2 mils wide. In one example, traces 30, 32, 34 and 36 each have a surface area of 50 mils wide by 40 mils long.

In operation, an electrical arc is generated between conductive surfaces 26 and 28, when a voltage or electric potential developed between conductive surfaces 26 and 28 exceeds a threshold value. If, for example, PTH 18 (and conductive surface 26) is in electrical communication (normally) with a signal path and PTH 20 (and conductive surface 28) is in electrical communication (normally) with a ground path, then the discharge current of the electrical arc flows from PTH 18 to PTH 20 and then to ground.

As shown in FIGS. 1 & 2, spark gap apparatus 10 further comprises auxiliary PTHs 38 and 40, which extend through substrate 12. Auxiliary PTH 38 is integrally connected to traces 30 and 34, and auxiliary PTH 40 is integrally connected to traces 32 and 36. PTH 38 is proximate to and in electrical communication (through traces 30 and 34) with PTH 18, and PTH 40 is proximate to and in electrical communication (through traces 32 and 36) with PTH 20. Preferably, but not necessarily, PTHs 38 and 40 should be located within about 2-3 mils of PTHs 18 and 20, respectively. Auxiliary PTHs 38 and 40 provide additional conductive paths that help reduce the resistance R of spark gap apparatus 10 and thus the $I^2R$ loss or heat generated from electrical discharges. Further, PTHs 38 and 40 provide additional thermally conductive mass, which helps absorb heat from electrical discharges and conduct it away from the gap. In the preferred embodiment, auxiliary PTHs 38 and 40 are open (not filled) to allow ambient air to circulate through. Thus, PTHs 38 and 40 function as heat pipes and heat sinks.

Opening 14 can be created in substrate 12 by any suitable method. In one preferred approach, opening 14 is created by laser ablation, using a high-powered green laser (e.g., 532 nm wavelengths), capable of ablating cooper. An example of such a laser is the LV 100 green laser from EO Technics Co., Ltd., S. Korea (having cutting speed of 10 mm/s; focusing optics f100 w/assist gas, air; and spot dia. 0.02 mm). Other suitable lasers may include the Starlase 200G-20 or 400G, by Powerlase Photonics, Ltd, Crawley, West Sussex, UK, a subsidiary of EO Technics Co., Ltd.). Other approaches include mechanical drilling, plasma arc etching, and high-pressure water jets to cut the opening. In one example, a small portion of the exterior of plating 18*b* and 20*b* is removed along the length of PTHs 18 and 20, adjacent opening 14, as shown in FIGS. 1-3. This removal of plating creates the flat conductive surfaces 26 and 28, which extend through substrate 12. As can be seen in FIG. 2, conductive surfaces 26 and 28 actually define part of opening 14. The interior portion of substrate 12 exposed in opening 14 (defining the remainder of opening 14) is best shown in FIGS. 2, 3 & 4, and is referred to by reference numeral 12*a*. Opening 14 is cut in the shape of an elongated slot. It is preferred that opening 14 be created after the other features of spark gap apparatus 10 have been fabricated.

Within contemplated variations of the first embodiment, conductive surfaces 26 and 28 may simply be the unaltered exteriors of plating 18*b* and 20*b*, exposed in opening 14. Alternatively, conductive surfaces 26 and 28 may be flats as shown, or cut or machined to some other suitable configuration, for example, one having sharp edges, striations, grooves, ridges, undulations, points, etc.

Referring now to FIGS. 5-8, a second embodiment of the invention is presented. A spark gap apparatus 110 comprises a substrate 112 containing an opening 114, a dielectric medium 116, a first spark gap electrode 118, and a second spark gap electrode 120. Substrate 112 contains a top surface 122 and a bottom surface 124. As shown in FIGS. 6 and 8, opening 114 extends completely through substrate 112. Opening 114 is generally defined by first and second opposing sides 114*a* and 114*b*. Dielectric medium 116 (stippling) may be any suitable dielectric, as discussed with respect to dielectric medium 16. Electrodes 118 and 120 are preferably implemented as cut sections of a PTH 119. PTH sections 118 and 120 are embedded in substrate 112 on opposing sides 114*a* and 114*b*, respectively, of opening 114, and are isolated from each other by opening 114 and dielectric medium 116.

As understood from FIG. 5, PTH 119 was produced from two intersecting holes 118*a* and 120*a* in substrate 112. PTH 119 contains plating material 118*b* and 120*b* and is made in accordance with well-known PC board fabrication techniques. A portion of the plating of PTH 119 (not shown) is removed during fabrication of opening 114 and PTH sections 118 and 120. A suitable diameter for intersecting holes 118*a* and 120*a* is about 25 mils, and a suitable thickness for plating material 118*b* and 120*b* is about 1 to 5 mils.

PTH sections 118 and 120 have conductive surfaces 126 and 128, respectively, that extend through substrate 112 and are exposed in opening 114 and to dielectric medium 116. As shown in FIGS. 6 & 8, conductive surface 126 is in opposing relation to conductive surface 128, and they are spaced apart from each other by a predetermined distance or gap width. As an example, a suitable gap width is about 5 mils if dielectric medium 116 is ambient air and about 2 mils if dielectric medium 116 is alumina. As shown in FIGS. 6 & 7, conductive surfaces 126 and 128 are bifurcated in that there are two parts to each surface. The two parts to each surface are created by the transverse cut through the wall of PTH 119 during fabrication of opening 114.

With further reference to FIGS. 5-8, substrate 112 includes conductive traces 130 and 132 situated on top surface 122. Trace 130 is integrally connected to PTH section 118 and is in electrical communication with conductive surface 126, and trace 132 is integrally connected to PTH section 120 and is in electrical communication with conductive surface 128. Traces 130 and 132 are preferably etched from copper plating on surface 122. Traces 130 and 132 include annular portions 130a and 132a, respectively, which are produced as part of the plating process of PTH 119 and merge with the remainder of the associated trace. Annular portions 130a and 132a are approximately 5 mils wide. A set of corresponding conductive traces 134 and 136 are situated on lower surface 124 of substrate 112. Trace 134 is integrally connected to PTH section 118 and trace 136 is integrally connected to PTH section 120. Traces 134 and 136 are also preferably etched from copper. Traces 134 and 136 include annular portions 134a and 136a, respectively, which are configured like annual portions 130a and 132a. In one example, traces 130, 132, 134 and 136 each have a surface area of 50 mils wide by 40 mils long.

In operation, an electrical arc is generated between conductive surfaces 126 and 128, when a voltage potential developed between the surfaces exceeds a threshold value. If, for example, PTH section 118 (and conductive surface 126) is in electrical communication (normally) with a signal path and PTH section 120 (and conductive surface 128) is in electrical communication (normally) with a ground path, then the discharge current of the arc flows from PTH section 118 to PTH section 120 and then to ground.

As shown in FIGS. 5 & 6, spark gap apparatus 110 further comprises auxiliary PTHs 138 and 140, which extend through substrate 112. Auxiliary PTH 138 is integrally connected to traces 130 and 134, and auxiliary PTH 140 is integrally connected to traces 132 and 136. PTH 138 is proximate to and in electrical communication (through traces 130 and 134) with PTH 118, and PTH 140 is proximate to and in electrical communication (through traces 132 and 136) with PTH 120. Auxiliary PTHs 138 and 140 are otherwise configured and function in the same manner as auxiliary PTHs 38 and 40 of the first embodiment.

Opening 114 is created in the same manner as described with respect to opening 14 in the first embodiment—preferably by laser ablation. However, in this second embodiment, a cut is made through PTH 119. The resulting longitudinal, cross-sectional cut surfaces of the wall of PTH 119 become the conductive surfaces 126 and 128. Opening 114 includes the interior space of PTH sections 118 & 120, in the case where dielectric medium 116 is ambient air (represented by stippling in FIG. 5). If dielectric medium 116 is a solid, the dielectric medium may not occupy the interior space of PTH sections 118 and 120, but may be bounded as indicated by dashed lines 116a. The interior portion of substrate 112 exposed in opening 114 (defining the remainder of opening 114) is best shown in FIGS. 6-8, and is referred to by reference numeral 112a. It is preferred that opening 114 be created after the other features of spark gap apparatus 110 have been fabricated.

Referring now to FIGS. 9-12, a third embodiment of the invention is presented. A spark gap apparatus 210 comprises a substrate 212 containing an opening 214, a dielectric medium 216, a first spark gap electrode 218, and a second spark gap electrode 220. Substrate 212 contains a top surface 222 and a bottom surface 224. As shown in FIG. 10, opening 214 extends completely through substrate 212. Opening 214 is generally defined by first and second opposing sides 214a and 214b. Dielectric medium 216 (stippling) may be any suitable dielectric, as discussed with respect to dielectric medium 16. Electrodes 218 and 220 are preferably implemented as cut sections of a generally round PTH 219. PTH sections 218 and 220 are embedded in substrate 212 on opposing sides 214a and 214b, respectively, of opening 214, and are electrically isolated from each other by opening 214 and dielectric medium 216. PTH 219 includes a hole 219a drilled or punched through substrate 212 and plating material 219b. PTH 219 is made in accordance with well-known PC board fabrication techniques. A portion of plating 219b is removed during fabrication of opening 214 and PTH sections 218, 220. A suitable diameter for hole 219a is about 40 mils, and a suitable thickness for plating 219b is about 1 to 5 mils.

PTH sections 218 and 220 have conductive surfaces 226 and 228, respectively, that extend through substrate 212 and are exposed in opening 214 and to dielectric medium 216. Conductive surface 226 is in opposing relation to conductive surface 228, and they are spaced apart by a predetermined distance or gap width. As an example, a suitable gap width is about 5 mils if dielectric medium 216 is ambient air or about 2 mils if dielectric medium 216 is alumina. Conductive surfaces 226 and 228 are bifurcated in that there are two parts to each surface. As understood from FIGS. 10 & 11, the two parts to each surface are created by the transverse cross cut through the wall of PTH 219.

With further reference to FIGS. 10-12, substrate 212 includes conductive traces 230 and 232 situated on top surface 222. Trace 230 is integrally connected to PTH section 218 and in electrical communication with conductive surface 226, and trace 232 is integrally connected to PTH section 220 and in electrical communication with conductive surface 228. Traces 230 and 232 are preferably etched from copper plating previously applied to surface 222. Traces 230 and 232 include annular portions 230a and 232a, which are, e.g., approximately 5 mils wide. A set of corresponding conductive traces 234 and 236 are situated on lower surface 224 of substrate 212. Trace 234 is integrally connected to PTH section 218 and trace 236 is integrally connected to PTH section 220. Traces 234 and 236 are also preferably etched from copper. Traces 234 and 236 include annular portions 234a and 236a, which are, e.g., approximately 5 mils wide. In one example, traces 230, 232, 234 and 236 each have a surface area of 50 mils wide by 40 mils long.

In operation, an electrical arc is generated between conductive surfaces 226 and 228, when a voltage potential developed between the surfaces exceeds a threshold value. If, for example, PTH section 218 (and conductive surface 226) is in electrical communication (normally) with a signal path and PTH section 220 (and conductive surface 228) is in electrical communication (normally) with a ground path, then the discharge current of the arc flows from PTH section 218 to PTH section 220 and then to ground.

As shown in FIGS. 9 & 10, spark gap apparatus 210 further comprises auxiliary PTHs 238 and 240, which extend through substrate 212. Auxiliary PTH 238 is integrally connected to traces 230 and 234, and auxiliary PTH 240 is integrally connected to traces 232 and 236. PTH 238 is proximate to and in electrical communication (through traces 230 and 234) with PTH 218, and PTH 240 is proximate to and in electrical communication (through traces 232 and 236) with PTH 220.

Auxiliary PTHs 238 and 240 are otherwise configured and function in the same manner as auxiliary PTHs 38 and 40 of the first embodiment.

Opening 214 is created in the same manner as described with respect to opening 114 in the second embodiment. The resulting cross-sectional cut surfaces of the wall of PTH 219 become conductive surfaces 226 and 228. Opening 214 includes the interior space of PTH sections 118 & 120, in the case where dielectric medium 216 is ambient air (represented by stippling in FIG. 9). If dielectric medium 216 is a solid, the dielectric medium may not occupy the interior space of PTH sections 118 and 120, but may be bounded as indicated by dashed lines 216a. The interior portion of substrate 212 exposed in opening 214 (defining the remainder of opening 214) is best shown in FIGS. 10-12, and is referred to by reference numeral 212a. It is preferred that opening 214 be created after the other features of spark gap apparatus 210 have been fabricated.

Referring now to FIGS. 13-16, a fourth embodiment of the present invention is presented. A spark gap apparatus 310 comprises a substrate 312 containing an opening 314, a dielectric medium 316, and first and second spark gap electrodes 318 & 320. Substrate 312 contains top and bottom surfaces 322 & 324. Dielectric medium 316 (stippling) may be any suitable dielectric or combination of dielectrics, as discussed previously. Electrodes 318, 320 are implemented as cut sections of a triplex PTH 319. Alternatively, electrodes 318, 320 may be initially formed or plated as separate sections. PTH sections 318, 320 are embedded in substrate 312, on opposite sides, respectively, of opening 314, and are isolated from each other by opening 314 and dielectric medium 316. As understood from FIG. 13, PTH 319 was produced from three intersecting holes 318a, 319a and 320a in substrate 312. PTH 319 includes plating material 319b and is made in accordance with well-known PC board fabrication techniques. A suitable diameter for intersecting holes 318a, 319a and 320a is about 25 mils, and a suitable thickness for plating 319b is about 1 to 5 mils. In one exemplary embodiment, plating 319b has a thickness of 1 mil. Opening 314 includes the interior space of PTH 319 and the space between PTH sections 318, 320. Thus, PTH sections 318, 320 and opposing portions 312a (FIG. 16) of substrate 312 (exposed in opening 314) define the shape of opening 314. Opening 314 extends through substrate 312, from surface 322 to surface 324 (FIG. 14).

As shown in FIGS. 14 & 16, PTH sections 318 and 320 have conductive surfaces 326 and 328, respectively. These conductive surfaces extend through substrate 312 and are exposed in opening 314 and to dielectric medium 316. As best shown in FIG. 16, conductive surfaces 326 & 328 include parallel portions 326a & 328a and divergent portions 326b & 328b, respectively. Conductive surface 326 is in opposing relation to conductive surface 328. Parallel portions 326a, 328a are spaced apart from each other by a predetermined average distance or gap width. In this embodiment, parallel portions 326a, 328a are substantially parallel, but do not need to be precisely parallel. An example of a suitable gap width is about 5 mils if dielectric medium 316 is ambient air and about 2 mils if dielectric medium 316 is alumina. As best shown in FIGS. 14 & 15, conductive surfaces 326, 328 are bifurcated in that there are two parts to each surface. The two parts to each surface are created by the transverse division of the wall of PTH 319 during fabrication of PTH sections 318, 320.

Spark gap operation is primarily established by the width of the gap between parallel (conductive surface) portions 326a, 328a and the dielectric strength of dielectric medium 316. An electrical arc is generated between parallel portions 326a, 328a when a voltage potential developed between portions 326a, 328a exceeds a threshold value. It is believed that the arc is initiated and established within opening 314, between portions 326a, 328a. It is believed that divergent portions 326b, 328b function like a "Jacob's Ladder," extinguishing the arc near the top and bottom surfaces of substrate 312.

Divergent portions 326b, 328b are produced by milling transverse grooves 315a and 315b into top surface 322 and bottom surface 324, respectively, of substrate 312 (FIGS. 13 & 14). The milling operation not only removes substrate material, but also plating 319b along the major axis of each groove 315a, 315b, resulting in divergent portions 326b, 328b. PTH 319 is then divided into PTH sections 318 and 320 by electrically burning plating 319b along the major axis of grooves 315a, 315b and down through substrate 312 (FIG. 16). Alternatively, or in combination with electrical burning, laser ablation may be employed to divide PTH sections 318, 320. This division of PTH 319 creates parallel (conductive surface) portions 326a, 328a and the gap between those portions (FIG. 16). Parallel portions 326a, 328a can be made smooth or rough, as indicated with respect to previous embodiments.

With further reference to FIGS. 13-16, substrate 312 includes conductive traces 330, 332 situated on top surface 322. Trace 330 is integrally connected to PTH section 318 and in electrical communication with conductive surface 326, and trace 332 is integrally connected to PTH section 320 and in electrical communication with conductive surface 328. Traces 330, 332 include annular portions 330a, 332a, respectively, which are produced as part of the plating process of PTH 319 (as an "annular trace") and merge with the remainder of the associated trace. Annular portions 330a, 332a are approximately 6 mils wide. If the manufacturing process of PTH 319 does not require an annular trace for PTH 319, annular portions 330a, 332a may be dispensed with. A set of corresponding conductive traces 334, 336 are situated on lower substrate surface 324. Trace 334 is integrally connected to PTH section 318 and trace 336 is integrally connected to PTH section 320. Traces 330, 332, 334, & 336 are preferably etched from copper plating on surfaces 322, 324. Traces 334, 336 include annular portions 334a, 336a, respectively, which are configured like annual portions 330a, 332a.

In a variation of the fourth embodiment, the step of producing divergent conductive surface portions 326b, 328b is dispensed with. That is, the milling operation to create grooves 315a and 315b is not performed. In this variation, parallel conductive surface portions 326a and 328a extend the entire length of PTH sections 318 and 320 (from substrate surface 322 to substrate surface 324). In this variation, PTH sections 318 and 320 are created in the same manner as described for the original version of the fourth embodiment.

Figure 18:
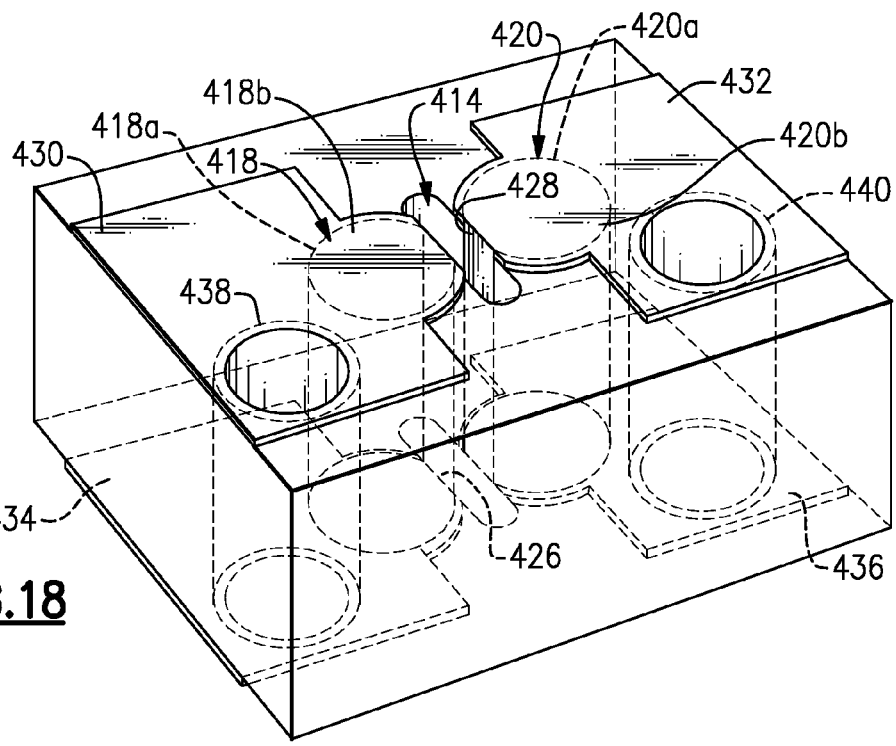
FIG. 18 is a perspective view of the spark gap apparatus of FIG. 17.

Referring now to FIGS. 17 & 18, a fifth embodiment of the invention is presented. The fifth embodiment is essentially identical to the first embodiment, except that the plated-through holes are completely filled with copper or other conductive material. As shown in FIGS. 17 and 18, a spark gap apparatus 410 comprises a substrate 412 containing an opening 414, a dielectric medium 416 in opening 414, a first spark gap electrode 418, and a second spark gap electrode 420. In this embodiment, opening 414 extends completely through substrate 412. Electrodes 418 and 420 are embedded in substrate 412 on opposing sides of opening 414. Dielectric medium 416 may be any suitable dielectric or combination of dielectrics, as indicated for dielectric medium 16. Opening 414 is created in the same manner as opening 14 of the first embodiment. The operation of spark gap apparatus 410 is the same as the operation of spark gap apparatus 10.

Electrodes 418 and 420 are implemented as filled plated-through holes (FPTHs), i.e., the plated-through holes are plated completely through, forming solid cylindrical electrodes in substrate 412. FPTHs 418 and 420 are produced by known PC board fabrication techniques and include holes 418a and 420b, respectively, and plating material 418b and 420b, respectively. Holes 418a and 420a are drilled, punched, or otherwise produced in substrate 412 and then plated solid through with copper or other plating material 418b and 420b, respectively. A suitable diameter for holes 418a and 420a is about 25 mils. FPTHs 418 and 420 each have an exterior, which is generally the exterior of plating 418b and 420b, respectively. The exteriors of FPTHs 418 and 420 include conductive surfaces 426 and 428, respectively, that extend through substrate 412 and are exposed in opening 414 and to dielectric medium 416. Conductive surfaces 426 and 428 may simply be the unaltered exteriors of FPTHs 418 and 420, exposed in opening 414. Alternatively, conductive surfaces 426 and 428 may be the cut flats as shown in FIG. 18, or cut or machined to some other suitable contour or configuration. Conductive surface 426 is spaced apart from conductive surface 428 by a predetermined distance or gap width. In many applications, a suitable gap width is about 5 mils if dielectric medium 416 is ambient air and about 2 mils if dielectric medium 416 is alumina. Alternatively, FPTHs 418, 420 could be filled with a conductive epoxy (e.g., containing tin or silver) or "liquid aluminum."

With further reference to FIGS. 17 and 18, substrate 412 includes conductive traces 430 and 432 situated on the top surface of substrate 412. Trace 430 is integrally connected to FPTH 418 and in electrical communication with conductive surface 426, and trace 432 is integrally connected to FPTH 420 and in electrical communication with conductive surface 428. Traces 430 and 432 are preferably etched from copper plating on substrate 412. A set of corresponding conductive traces 434 and 436 are situated on the bottom of substrate 412. Trace 434 is integrally connected to FPTH 418 and trace 436 is integrally connected to FPTH 420. Traces 434 and 436 are also preferably etched from copper plating.

Spark gap apparatus 410 further comprises auxiliary PTHs 438 and 440, extending through substrate 412. Auxiliary PTH 438 is integrally connected to traces 430 and 434, and auxiliary PTH 440 is integrally connected to traces 432 and 436. PTH 438 is proximate to and in electrical communication (through traces 430 and 434) with FPTH 418, and PTH 440 is proximate to and in electrical communication (through traces 432 and 436) with FPTH 420. It is preferred that auxiliary PTHs 438 and 440 not be filled, but remain open to allow ambient air to circulate through.

The above-described embodiments of the present invention (FIGS. 1-18) are illustrated in generic form. The depiction of each embodiment may represent a separate device or a subassembly for a separate device, such as a surface mount device. Alternatively, the depiction of each embodiment may represent a section of a PC board, separated conceptually from the remainder of the board for ease of illustration. In the latter case, the conductive traces (e.g., traces 30, 32, 34 and 36) may be connected to (or become part of) other printed circuit traces on the PC board.

Within the contemplated variations of the above-described embodiments, the cut into or through, or other dissection of, the plated-through hole can be smooth, producing smooth conductive surfaces (e.g., surfaces 26, 28 or 126, 128). Alternatively, a cut or other dissection could be made that produces rough conductive surfaces or conductive surfaces having jagged or sharp edges or barbs. Further, the conductive surfaces may be configured with striations, grooves, ridges, undulations, points, etc.

Referring now to FIGS. 19-21, there is shown an electronic filter apparatus 500, comprising a PC board 502 having a top mounting surface 502a (FIG. 19), a bottom mounting surface 502b (FIG. 20), and conductive traces 504. Conductive traces 504 include signal traces 504a and ground traces 504b. Filter apparatus 500 further comprises electronic components 506 surface mounted to conductive traces 504. Electronic components 506 are surface mount inductors and capacitors coupled together, via traces 504, to form an electronic filter circuit 507 (FIG. 21). Components 506 include capacitors C0 to C4 and C10 to C12 and inductors L10 to L13. The capacitor and inductor designations (e.g., C0, C1 . . . ) in the schematic of FIG. 21 correspond to the component designations in FIG. 19. As shown, filter circuit 507 is in electrical communication with both signal traces 504a and ground traces 504b. In this example, filter circuit 507 is an elliptic function, lowpass filter; however, it could be any type of filter. Capacitor C0 is a DC blocking capacitor. Filter apparatus 500 further comprises an input conductor 508a and an output conductor 508b, both mounted to PC board 502 by means of, for example, well-known wave soldering techniques. As shown, input and output conductors 508a and 508b are soldered to signal traces 504a and are in electrical communication with filter circuit 507. As indicated in FIG. 21, filter circuit 507 has an input end 507a and an output end 507b. Input conductor 508a is connected to input end 507a and is able to deliver a signal to be filtered to filter circuit 507. Output conductor 508b is connected to output end 507b and is able to carry away a signal filtered by filter circuit 507.

As shown in FIGS. 19-21, PC board 502 is equipped with two spark gap apparatus 510a and 510b. Spark gap apparatus 510a is connected between filter input end 507a and ground (FIG. 21), and spark gap apparatus 510b is connected between filter output end 507b and ground (FIG. 21). In the example of FIGS. 19-21, spark gap apparatus 510a and 510b are configured and function like the fourth embodiment of FIGS. 13-16. The primary elements of the fourth embodiment are indicated in FIGS. 19 & 20 using like reference numerals. Spark gap apparatus 510a and 510b each contain an opening 514 extending through PC board 502. Opening 514 is occupied by ambient air as the dielectric medium; however, a solid dielectric medium may be used, such as alumina. Each spark gap apparatus 510a and 510b includes PTH sections 518 and 520 embedded in PC board 502, which function as the spark gap electrodes. PTH sections 518 and 520 are configured like PTH sections 318 and 320 of the fourth embodiment (FIGS. 13-16), and function in the same way. A signal trace 530 and ground trace 532 are associated with each spark gap apparatus 510a and 510b, on top surface 502a (FIG. 19). And, a signal trace 534 and ground trace 536, corresponding to traces 530 and 532 respectively, are situated on bottom surface 502b (FIG. 20). Signal traces 530 and 534 are integrally connected to PTH section 518, and traces 532 and 536 are integrally connected to PTH section 520. It is to be understood that spark gap apparatus 510a and 510b may take the form of any of the previously described embodiments, not just the fourth embodiment.

Figure 22:
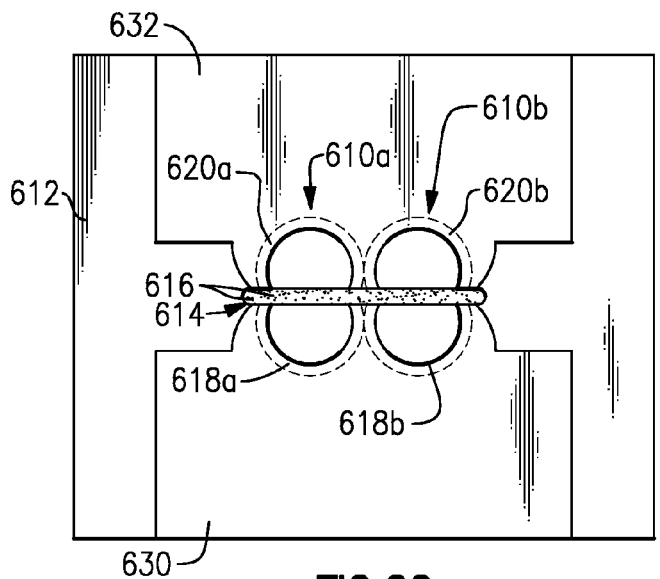
FIG. 22 is a top plan view of two of the spark gap apparatus of FIG. 1, in a parallel arrangement.

Referring now to FIG. 22, two spark gap apparatus 610a and 610b are shown placed in a parallel arrangement. Apparatus 610a and 610b are each configured in accordance with the first embodiment of the present invention. This arrangement allows the threshold voltage to remain the same as a single spark gap apparatus, while increasing (and possibly doubling) the current carrying and heat distribution capacity of the combined apparatus. Apparatus 610a and 610b share a substrate 612 and an elongated opening 614 occupied by a dielectric medium 616. Apparatus 610a includes a pair of PTHs 618a and 620a and apparatus 610b includes a pair of PTHs 618b and 620b. Each pair operates as a set of spark gap electrodes, as described with respect to the first embodiment. A pair of conductive traces 630 and 632 is formed on top of substrate 612. Trace 630 is integrally connected to PTHs 618a and 618b, and trace 632 is integrally connected to PTHs 620a and 620b. A corresponding pair of conductive traces may be located on the opposite side of substrate 612 and connected to PTHs 618a, 618b and PTHs 620a, 620b, respectively. In application, trace 630 (and thus PTHs 618a & 618b) may be connected to a signal path and trace 632 (and thus PTHs 620a & 620b) may be connected to ground.

Figure 23:
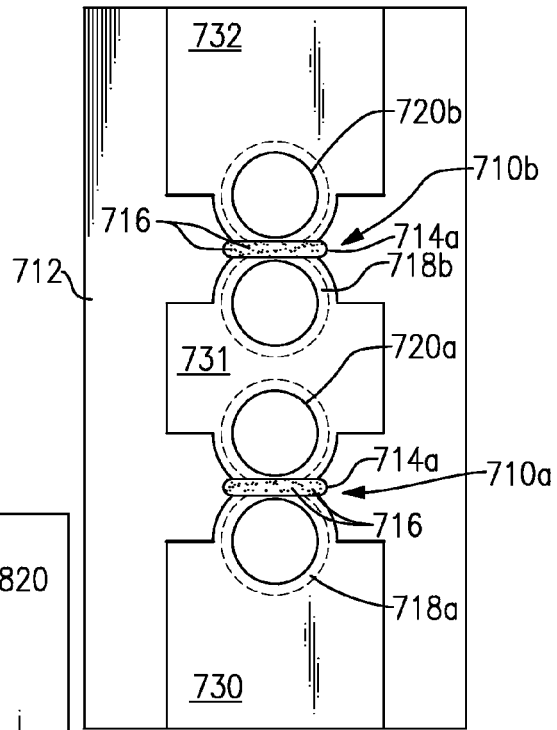
FIG. 23 is a top plan view of two of the spark gap apparatus of FIG. 1, in a series arrangement.

Referring to FIG. 23, two spark gap apparatus 710a and 710b are shown placed in a series arrangement. Apparatus 710a and 710b are each configured in accordance with the first embodiment of the present invention. Apparatus 710a and 710b share a substrate 712. Apparatus 710a and 710b include openings 714a and 714b, respectively, each of which extends through substrate 712. Openings 714a and 714b have approximately the same dimensions and are occupied by a dielectric medium 716. Apparatus 710a includes a pair of PTHs 718a and 720a and apparatus 710b includes a pair of PTHs 718b and 720b. Each pair operates as a set of spark gap electrodes, as described with respect to the first embodiment. A set of conductive traces 730, 731 and 732 are formed on top of substrate 712. Trace 730 is integrally connected to PTHs 718a, trace 731 is integrally connected to PTHs 720a and 718b, and trace 732 is integrally connected to PTH 720b. A corresponding set of conductive traces may be located on the opposite side of substrate 712 and connected to PTH 718a, PTHs 720a and 718b, and PTH 720b, respectively. In application, trace 730 (and thus PTH 718a) may be connected to a signal path and trace 732 (and thus PTH 720b) may be connected to ground. The series arrangement of FIG. 19 distributes the required threshold voltage over spark gap apparatus 710a and 710b. This reduces the required arc-over voltage of each apparatus (possibly by as much as a half) compared to a single spark gap apparatus, and thus reduces the degradation of the spark gap electrodes. Also, openings 714a and 714b can be made narrower, which, it is believed, will lead to more repeatable gap widths in production and more consistent arc-over voltages in operation. The multiple elements of this series arrangement will also provide additional current carrying and heat distribution capacity.

Figure 24:
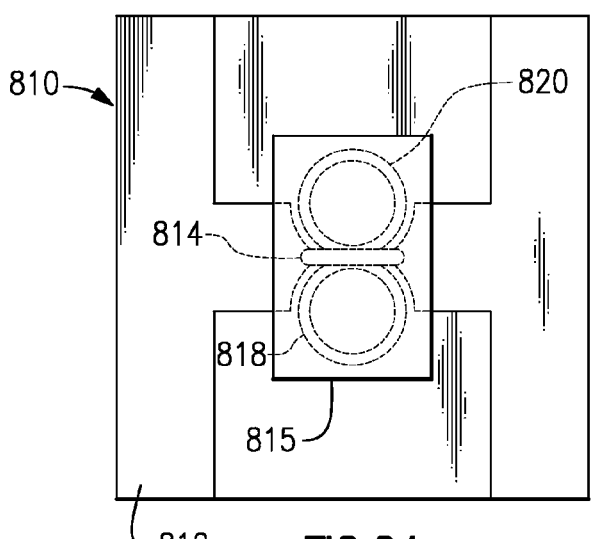
FIG. 24 is a top plan view of the spark gap apparatus of FIG. 1 covered with a mask, as a preliminary manufacturing step before a wave soldering or conformal coating step.

Referring now to FIG. 24, there is shown a spark gap apparatus 810 configured in accordance with the first embodiment. Apparatus 810 is implemented in connection with a substrate 812 which contains an opening 814. Apparatus 810 further includes PTHs 818 and 820 which function as the spark gap electrodes, as previously described. In the case where opening 814 merely contains ambient air (or in other implementations where opening 814 must remain clear), it may be desirable to place a mask 815 over opening 814, or over both opening 814 and PTHs 818 & 820, during fabrication. Protective conformal coatings are sometimes applied to the surface(s) of substrate 812, which can clog opening 814 and PTHs 818 & 820 if not covered. Such a protective coating may be an elastomeric or other dielectric material, which environmentally protects PC boards or PC boards populated with electronic components. (See, e.g., a reference to such coatings in U.S. Pat. No. 5,969,924 to Noble.) Mask 815 may be a piece of any suitably adhering, durable tape to provide a barrier to the above-mentioned protective coatings. Mask 815 may also be employed as a barrier to keep solder from infiltrating opening 814 and PTHs 818 & 820 during, e.g., a wave-soldering process of substrate 812. In the latter case, mask 815 is preferably made of a soldermask material such as solder resist tape. In either the conformal coating or wave-solder case, a second mask (not shown) may be employed on the opposite side of substrate 812, in registration with the opposite ends of opening 814 and PTHs 818 & 819 (which extend through substrate 812).

Figure 25:
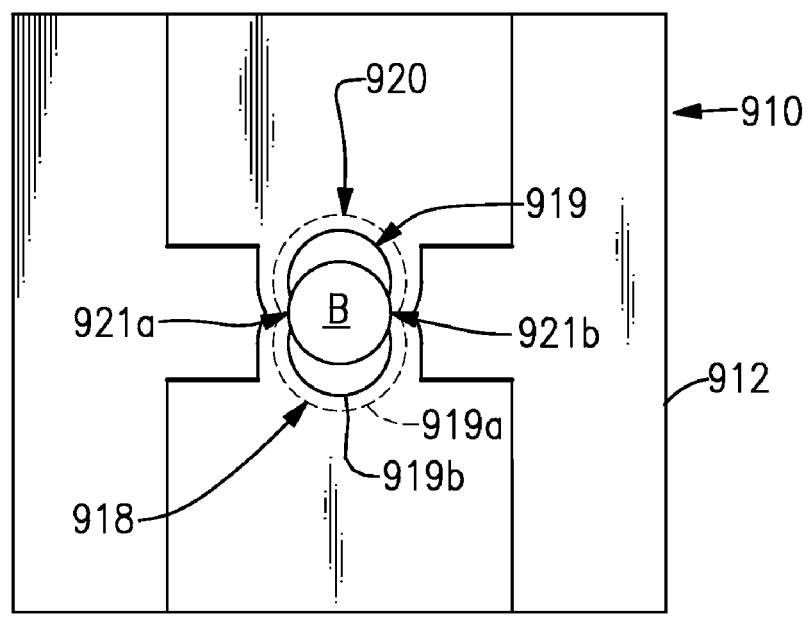
FIG. 25 is a top plan view illustrating a preliminary step in an alternative fabrication process for the spark gap apparatus of FIG. 5.

Referring now to FIG. 25, a spark gap apparatus 910 is shown in the process of being fabricated in a substrate 912. Apparatus 910 is to be configured in accordance with the second embodiment of the present invention (FIGS. 5-8). FIG. 25 illustrates an alternative method of fabricating the second embodiment. Substrate 912 is typically a circuit board made of, for example, FR-4 or alumina. A PTH 919 is produced in substrate 912 as previously explained with respect to the second embodiment. PTH 919 includes a generally oblong hole 919a and plating material 919b. PTH 919 corresponds to PTH 119 in FIG. 5. As illustrated in FIGS. 5 and 6, a portion of the plating of PTH 119 is removed by a transverse laser cut through PTH 119, during fabrication of opening 114. Rather than making a direct laser cut or electrically burning through PTH 919, an alternative method can be employed—drilling PTH 919 with a drill bit B (FIG. 25). Drill bit B is positioned at the geometric center of PTH 919, and is used to mill and remove all or most of plating 919b at points 921a and 921b. If all of plating 919b is removed at points 921a and 921b, then two separated PTH sections 918 and 920 would be created. PTH sections 918, 920 would naturally have sharp edges near points 921a and 921b, without further processing. In a further optional step, the sharp edges are burned back using a low voltage, high current source. This would result in relatively blunt surfaces, which are more consistent and continuous than the sharp edges. These edges or blunt surfaces would function as the conductive surfaces of PTH sections 918 and 920 (i.e., the spark gap electrodes). Alternatively, not all of plating 919b is removed by drill bit B, at points 921a and 921b. Complete separation of PTH sections 918, 920 would then be accomplished by burning through the remaining plating 919b (at points 921a and 921b) with the low voltage, high current source or by laser ablation.

In alternative embodiments of the invention, where a plated-through hole or holes are used for the spark gap electrodes, the plated-through hole or holes do not have to be round or circular. The plated-through holes can be any shape, such as, for example, square, rectangular, oval, triangular, or star shaped. The terms "plated-through hole," "plated-through holes," "PTH," or "PTHs," as used in this specification, are to be construed to encompass any shape, not just round or circular.

Figure 26:
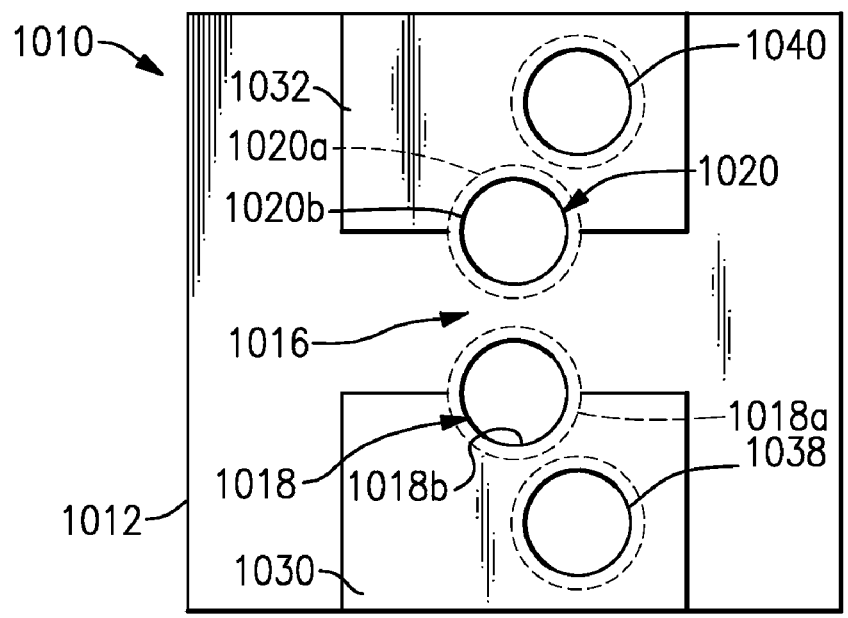
FIG. 26 is a top plan view of a modification of the first embodiment of the present invention, dispensing with the opening between spark gap electrodes.

In a modification of, e.g., the first embodiment (FIGS. 1-4), opening 14 may be dispensed with if substrate (or PC board) 12 itself has the desired dielectric properties for dielectric medium 16. For example, alumina (or an alumina ceramic) may serve as the material for both substrate 12 and dielectric medium 16. This modification is shown in FIG. 26. Spark gap apparatus 1010 includes a substrate 1012, a gap 1016, spark gap electrodes 1018 and 1020, conductive traces 1030 and 1032, and auxiliary PTHs 1038 and 1040. Electrodes 1018 and 1020 are implemented as PTHs. PTHs 1018 and 1020 are spaced from each other by gap 1016. The material of substrate 1012 in gap 1016 is the same as and continuous with the remainder of substrate 1012. Substrate 1012 is made of a dielectric material having properties suitable for a dielectric medium of a spark gap (e.g., alumina). Trace 1030 is integrally connected to PTHs 1018, 1038, and trace 1032 is integrally connected to PTHs 1020, 1040. As with the first embodiment, there is a corresponding pair of conductive traces on the opposite side of substrate 1012 (not shown). The width of gap 1016 may be, for example, 2 mils if substrate 1012 is made of alumina. PTHs 1018, 1020 include holes 1018a, 1020a, respectively, and plating material 1018b, 1020b, respectively, in substrate 1012. Those portions of plating 1018b and 1020b that face each other, in gap 1016, function as the conductive surfaces of apparatus 1010. Annular portions (not shown) may partially surround PTHs 1018 and 1020 if the manufacturing process employed requires an annular trace around the plated-through holes. In the embodiment of FIG. 26, annular traces were not required by the manufacturing process. Except as specifically pointed out here, apparatus 1010 is configured in the same way and functions in the same manner as described with respect to the first embodiment.

Referring now to FIGS. 27-30, a sixth embodiment of the present invention is presented. A spark gap apparatus 1110 comprises a substrate 1112 containing an opening 1114, a dielectric medium 1116, and first and second spark gap electrodes 1118 & 1120. Substrate 1112 contains top and bottom surfaces 1122 & 1124. Opening 1114 extends through substrate 1112, from surface 1122 to surface 1124 (FIG. 28). Dielectric medium 1116 (stippling in FIG. 27) may be any suitable dielectric or combination of dielectrics, as previously discussed. Electrodes 1118, 1120 are isolated from each other by opening 1114 and dielectric medium 1116. Electrodes 1118 & 1120 comprise PTH sections 1118a & 1120a, respectively, and electrically conductive fill material 1118b & 1120b, respectively. Fill material 1118b & 1120b include head portions 1118bb & 1120bb, respectively, which have conductive surfaces 1126 & 1128, respectively. Fill material can be any electrically conductive material suitable for filling a hole, plated hole, or plated-through hole in a substrate such as a printed circuit board. For example, the fill material may be copper plating or an electrically conductive epoxy or adhesive that can be cured to a solid. The fill material is preferably conductive epoxy, because it is easier (compared to copper plating) to laser ablate (or otherwise cut through) such material when creating opening 1114. Suitable conductive epoxies include Duralco® 126 silver filled or Duralco® 127 graphite filled conductive epoxies, both supplied by Cotronics Corp, Brooklyn, N.Y., www.cotronics.com.

PTH sections 1118a, 1120a and conductive fill material 1118b, 1120b are situated within a triplex hole 1119 (comprising three intersecting holes) drilled or otherwise produced through substrate 1112. PTH sections 1118a & 1120a are fabricated essentially as plated-through holes (in a well-known manner) and have plating 1118aa & 1120aa, respectively. In this embodiment, the center intersecting hole of triplex hole 1119 is not plated. A suitable diameter for the three intersecting holes of triplex hole 1119 is preferably between 25 and 50 mils. A suitable thickness for plating 1118aa, 1120aa is about 1 to 5 mils. In one exemplary embodiment, plating 1118aa and 1120aa are each 1 mil thick.

As shown in FIGS. 28-30, conductive surfaces 1126 & 1128 of spark gap electrodes 1118 & 1120, respectively, extend through substrate 1112 and are exposed in opening 1114 and to dielectric medium 1116. As best shown in FIG. 29, conductive surface 1126 is in opposing relation to conductive surface 1128 and spaced apart from each other by a predetermined average distance or gap width. An electrical arc is generated between conductive surfaces 1126, 1128 when a voltage potential between the surfaces exceeds a threshold value. The arc occurs immediately between the electrically conductive fill material rather than immediately between the copper plating of PTH sections 1118a, 1120a. A suitable gap width is about 5 mils if the dielectric medium is ambient air and about 2 mils if the dielectric medium is alumina.

With further reference to FIGS. 27-30, conductive traces 1130 & 1132 are situated on top surface 1122 of substrate 1212. Trace 1130 is integrally connected to PTH section 1118a and is in electrical communication with fill material 1118b and conductive surface 1126. Trace 1132 is integrally connected to PTH section 1120a and is in electrical communication with fill material 1120b and conductive surface 1128. A corresponding set of conductive traces 1134, 1136 are situated on bottom substrate surface 1124. Trace 1134 is integrally connected to PTH section 1118a and trace 1136 is integrally connected to PTH section 1120a. Traces 1130, 1132, 1134, & 1136 are preferably etched from copper plating originally applied to the surfaces of substrate 1112.

In fabrication, triplex hole 1119 is first drilled (or otherwise produced) in substrate 1112. Copper plating is then plated onto both surfaces 1122, 1124 of substrate 1112 and PTH sections 1118a, 1120a are plated into the two outside holes of triplex hole 1119. The center hole of triplex hole 1119 is not plated. The copper plating on surfaces 1122, 1124 is etched away to produce conductive traces 1130, 1132, 1134 & 1136. Then, if the fill material is electrically conductive epoxy, the epoxy is added to fill PTH sections 1118a, 1120a and the center hole of triplex hole 1119. The epoxy is then cured, either with heat or at room temperature. If the fill material is copper plating, then the plating is applied initially when the plating is applied to the surfaces of substrate 1112. Opening 1114 is then made by laser ablation. As best shown in FIGS. 27 & 28, the laser ablates the fill material in the center hole of triplex hole 1119 and a small portion of substrate 1112 on each side of the center hole. If the fill material is epoxy, the laser ablating process is made much easier because the laser is not required to work through copper plating. The primary advantage of epoxy is that a less expensive laser can be used to create opening 1114. Of course, alternative or additional means may be employed to create opening 1114, including but not limited to mechanical drilling and/or electrical burning. Opening 1114 separates the electrically conductive fill in the center hole, completing head portions 1118bb, 1120bb and creating conductive surfaces 1126, 1128. Conductive surfaces 1126, 1128 can be made smooth or rough, as indicated with respect to previous embodiments.

Figures 31, 33, 34:
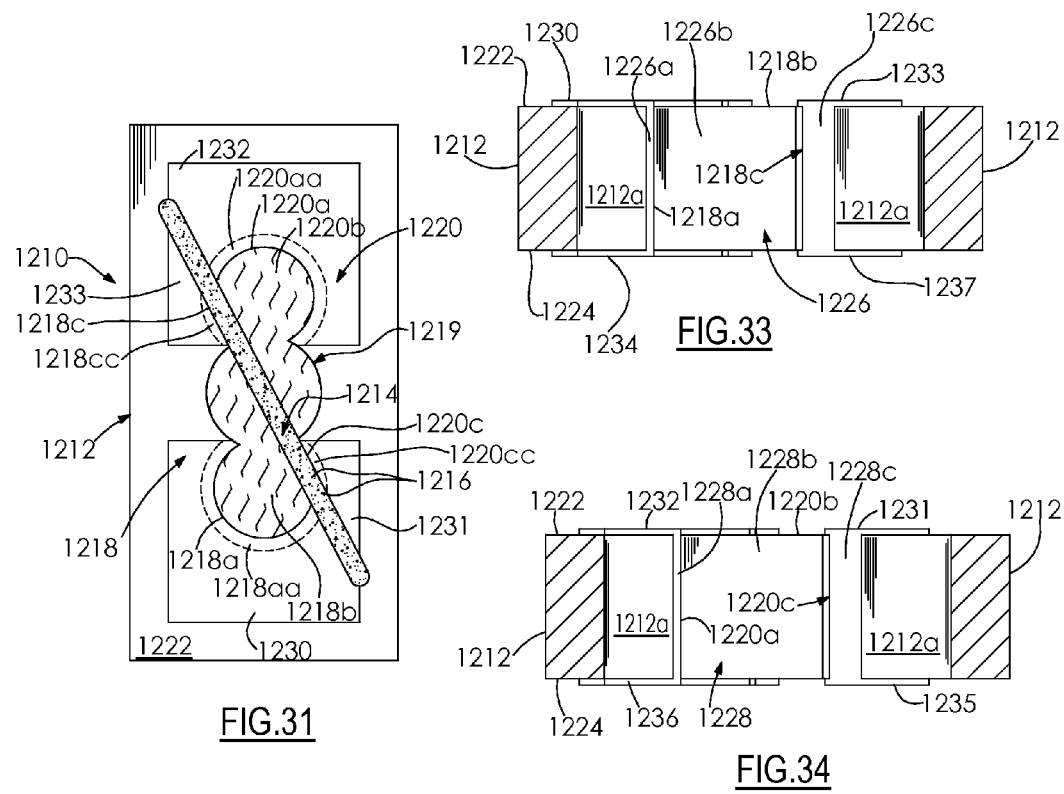
FIG. 31 is a top plan view of a seventh embodiment of the spark gap apparatus of the present invention, employing electrically conductive fill material as part of the spark gap electrodes.
FIG. 33 is a cross-sectional view of the spark gap apparatus of FIG. 31, taken along line 33-33 in FIG. 32.
FIG. 34 is a cross-sectional view of the spark gap apparatus of FIG. 31, taken along line 34-34 in FIG. 32.
Figure 32:
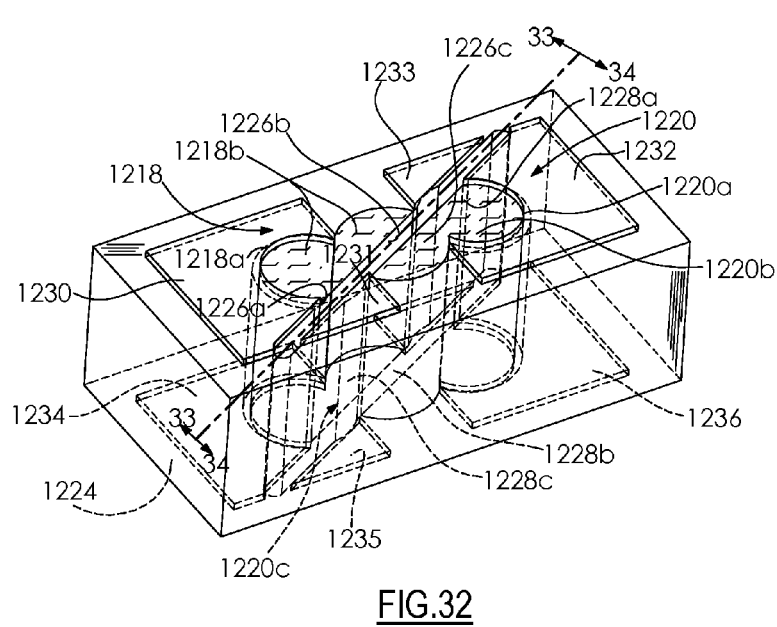
FIG. 32 is a perspective view of the spark gap apparatus of FIG. 31.

Referring now to FIGS. 31-34, a seventh embodiment of the present invention is presented. A spark gap apparatus 1210 comprises a substrate 1212 containing an opening 1214, a dielectric medium 1216, and first and second spark gap electrodes 1218 & 1220. Substrate 1212 contains top and bottom surfaces 1222 & 1224. Opening 1214 extends through substrate 1212, from surface 1222 to surface 1224 (FIG. 32). Dielectric medium 1216 (stippling in FIG. 31) may be any suitable dielectric or combination of dielectrics, as previously discussed. Electrodes 1218 & 1220 are isolated from each other by opening 1214 and dielectric medium 1216. Electrodes 1218 & 1220 comprise first PTH sections 1218a & 1220a, respectively, electrically conductive fill material 1218b & 1220b, respectively, and second PTH sections 1218c & 1220c, respectively. The fill material is the same as described with respect to the sixth embodiment. PTH sections 1218a, 1220a, 1218c, 1220c and conductive fill material 1218b, 1220b are situated within a triplex hole 1219 extending through substrate 1212. PTH sections 1218a, 1220a, 1218c, & 1220c have plating 1218aa, 1220aa, 1218cc, & 1220cc, respectively. The center hole of triplex hole 1219 is not plated. A suitable diameter for the three intersecting holes of triplex hole 1219 is between 25 and 50 mils. A suitable thickness for plating 1218aa & 1220aa is about 1 to 5 mils.

Spark gap electrodes 1218 & 1220 have conductive surfaces 1226 & 1228, respectively. Conductive surface 1226 comprises a conductive surface 1226a of first PTH section 1218a, a conductive surface 1226b of fill material 1218b, and a conductive surface 1226c of second PTH section 1218c (FIGS. 32-33). Conductive surface 1228 comprises a conductive surface 1228a of first PTH section 1220a, a conductive surface 1228b of fill material 1220b, and a conductive surface 1228c of second PTH section 1220c (FIGS. 32 & 34). As shown in FIGS. 32-34, the conductive surfaces extend through substrate 1212 and are exposed in opening 1214 and to dielectric medium 1216. As best understood from FIGS. 31-32, conductive surface 1226 is in opposing relation to conductive surface 1228 and spaced apart from each other by a predetermined average distance or gap width. A suitable gap width is about 5 mils if the dielectric medium is ambient air and about 2 mils if the dielectric medium is alumina.

With further reference to FIGS. 31-34, conductive traces 1230, 1232 are situated on top surface 1222 of substrate 1212. Trace 1230 is integrally connected to PTH section 1218a and is in electrical communication with fill material 1218b and conductive surfaces 1226a, 1226b. Trace 1232 is integrally connected to PTH section 1220a and is in electrical communication with fill material 1220b and conductive surfaces 1228a, 1228b. Top surface 1222 also includes conductive traces 1231 & 1233. Trace 1231 is adjacent trace 1230, but electrically isolated therefrom by opening 1214. Trace 1233 is adjacent trace 1232, but electrically isolated therefrom by opening 1214. Trace 1231 is integrally connected to PTH section 1220c and in electrical communication with conductive surface 1228c (FIG. 34). Trace 1233 is integrally connected to PTH section 1218c and in electrical communication with conductive surface 1226c (FIG. 33). Trace 1231, PTH section 1220c, and conductive surface 1228c are electrically isolated, by physical separation, from the rest of spark gap electrode 1220; however, they can be brought into electrical communication with electrode 1220 by, e.g., a bridging trace, jumper wire, or by bridging the separation with plating or fill material. Similarly, trace 1233, PTH section 1218c, and conductive surface 1226c are electrically isolated from the rest of spark gap electrode 1218; however, they can similarly be brought into electrical communication with electrode 1218.

On bottom surface 1224 of substrate 1212, there is a corresponding set of conductive traces. A trace 1234 is integrally connected to PTH section 1218a and is in electrical communication with fill material 1218b and conductive surfaces 1226a, 1226b. A trace 1236 is integrally connected to PTH section 1220a and is in electrical communication with fill material 1220b and conductive surfaces 1228a, 1228b. Bottom surface 1224 also includes conductive traces 1135 & 1137. Trace 1235 is adjacent trace 1234, but electrically isolated therefrom by opening 1214, and trace 1237 is adjacent trace 1236, but electrically isolated therefrom by opening 1214. Trace 1235 is integrally connected to PTH section 1220c and in electrical communication with conductive surface 1228c (FIG. 34). Trace 1237 is integrally connected to PTH section 1218c and in electrical communication with conductive surface 1226c (FIG. 33). Trace 1235 is electrically isolated, by physical separation, from the rest of spark gap electrode 1220; however, it can be brought into electrical communication with electrode 1220 as previously described with respect to trace 1231. Similarly, trace 1237 is electrically isolated from the rest of spark gap electrode 1218; however, it can similarly be brought into electrical communication with electrode 1218.

The fabrication of spark gap apparatus 1210 is essentially the same as for spark gap apparatus 1110 up to the point of fabricating opening 1214. Instead of creating a transverse opening (1114) as in apparatus 1110, an elongated diagonal opening (1214) is created. Opening 1214 traverses all three intersecting holes of triplex hole 1219 and passes through the initially etched conductive traces on the surfaces of substrate 1212 and through the plating of the plated-through holes (i.e., outer two holes of triplex hole 1219). Thus, the fabrication step for creating opening 1214, in turn, completes the fabrication of PTH sections 1218a, 1220c, 1220a & 1218c and traces 1230, 1231, 1232, 1233, 1234, 1235, 1236, & 1237. Opening 1214 is preferably made by laser ablation. However, in this embodiment, the laser must be capable of ablating the copper plating of the traces and plated-through holes, in addition to the conductive fill material (See FIGS. 31 & 32). Of course, alternative or additional means may be employed to create opening 1214, as described for the sixth embodiment. Conductive surfaces 1226a, 1226b & 1226c and 1228a, 1228b & 1228c can be made smooth or rough, as indicated for previous embodiments.

In operation, an electrical arc is generated between spark gap electrodes 1218 & 1220 when a voltage potential between the electrodes exceeds a threshold value. In particular, arcing (spark gap operation) occurs between the fill (e.g., electrically conductive epoxy) conductive surfaces 1226b and 1228b. If traces 1231 and/or 1235 are connected to electrode 1220, then arcing (spark gap operation) may also occur between conductive surfaces 1226a and 1228c and between conductive surfaces 1226b and 1228c. If traces 1233 and/or 1237 are connected to electrode 1218, then arcing (spark gap operation) may also occur between conductive surfaces 1226c and 1228a and between conductive surfaces 1226c and 1228b. Like the sixth embodiment, the spark gap electrodes of the seventh embodiment employ a relatively large mass of electrically conductive fill (1218b & 1220b), which contributes to the durability of the spark gap apparatus over repeated arc discharges.

Referring now to FIGS. 35-38, an eighth embodiment of the present invention is presented, which, like the sixth and seventh embodiments, includes electrically conductive fill material to form at least part of the spark gap electrodes. A spark gap apparatus 1310 comprises a substrate 1312 containing an opening 1314, a dielectric medium 1316, and first and second spark gap electrodes 1318 & 1220. Substrate 1312 contains top and bottom surfaces 1322 & 1324. Opening 1314 extends through substrate 1312, from surface 1322 to surface 1324 (FIG. 36). Dielectric medium 1316 (stippling in FIG. 35) may be any suitable dielectric or combination of dielectrics. Electrodes 1318 & 1320 are isolated from each other by opening 1314 and dielectric medium 1316. Electrodes 1318 & 1320 comprise first PTH sections 1318a & 1320a, respectively, electrically conductive fill material 1318b & 1320b, respectively, and second PTH sections 1318c & 1320c, respectively. The fill material is the same as described with respect to the sixth embodiment. PTH sections 1318a, 1320a, 1318c, 1320c and conductive fill material 1318b, 1320b are situated within a triplex hole 1319 extending through substrate 1312. PTH sections 1318a, 1320a, 1318c, & 1320c have plating 1318aa, 1320aa, 1318cc, & 1320cc, respectively. The center hole of triplex hole 1319 is not plated. A suitable diameter for the three intersecting holes of triplex hole 1319 is between 25 and 50 mils. A suitable thickness for plating 1318aa, 1320aa, 1318cc, & 1320cc is about 1 to 5 mils.

Spark gap electrodes 1318 & 1320 have conductive surfaces 1326 & 1328, respectively. Conductive surface 1326 comprises a conductive surface 1326a of first PTH section 1318a, a conductive surface 1326b of fill material 1318b, and a conductive surface 1326c of second PTH section 1318c (FIGS. 35, 36 & 38). Conductive surface 1328 comprises a conductive surface 1328a of first PTH section 1320a, a conductive surface 1328b of fill material 1320b, and a conductive surface 1328c of second PTH section 1320c (FIGS. 35 & 36). As shown in FIG. 36, the conductive surfaces extend through substrate 1312 and are exposed in opening 1314 and to dielectric medium 1316. As best understood from FIGS. 35 & 36, conductive surface 1326 is in opposing relation to conductive surface 1328 and spaced apart from each other by a predetermined average distance or gap width.

With further reference to FIGS. 35-38, conductive traces 1330, 1332 are situated on top surface 1322 of substrate 1312. Trace 1330 is integrally connected to PTH section 1318a and is in electrical communication with fill material 1318b and conductive surfaces 1326a, 1326b, & 1326c (i.e., fill material 1318b is in direct physical contact with plating 1318aa & 1318cc). Trace 1332 is integrally connected to PTH section 1320a and is in electrical communication with fill material 1320b and conductive surfaces 1328a, 1328b, & 1328c (i.e., fill material 1320b is in direct physical contact with plating 1320aa & 1320cc). Top surface 1322 also includes conductive traces 1331 & 1333. Trace 1331 is adjacent to trace 1330, but electrically isolated therefrom by opening 1314; and trace 1333 is adjacent to trace 1332, but electrically isolated therefrom by opening 1314. Trace 1331 is integrally connected to PTH section 1320c, and trace 1333 is integrally connected to PTH section 1318c (FIGS. 35 & 36). On bottom surface 1324 of substrate 1312, there is a corresponding set of conductive traces. A trace 1334 is integrally connected to PTH section 1318a and is in electrical communication with fill material 1318b and conductive surfaces 1326a, 1326b, & 1326c. A trace 1336 is integrally connected to PTH section 1320a and is in electrical communication with fill material 1320b and conductive surfaces 1328a, 1328b, & 1328c. Bottom surface 1324 also includes conductive traces 1135 & 1137. Trace 1335 is adjacent to trace 1334, but electrically isolated therefrom by opening 1314; and trace 1337 is adjacent to trace 1336, but electrically isolated therefrom by opening 1314. Trace 1335 is integrally connected to PTH section 1320c, and trace 1337 is integrally connected to PTH section 1318c (FIGS. 35 & 36).

The fabrication of spark gap apparatus 1310 is essentially the same as for spark gap apparatus 1210, except that the opening (1314) has a different shape. Opening 1314 traverses triplex hole 1319 in a right-angle pattern, and passes through the initially etched conductive traces on the surfaces of substrate 1312 and through the plating of the plated-through holes (i.e., outer two holes of triplex hole 1319). The fabrication step for creating opening 1314, in turn, completes the fabrication of PTH sections 1318a, 1320c, 1320a & 1318c and traces 1330, 1331, 1332, 1333, 1334, 1335, 1336, & 1337. Opening 1314 is fabricated in the same manner as described with respect to the seventh embodiment.

In operation, an electrical arc is generated between spark gap electrodes 1318 & 1320 when a voltage potential between the electrodes exceeds a threshold value. In particular, arcing (spark gap operation) occurs between the fill (e.g., electrically conductive epoxy) conductive surfaces 1326b and 1328b, and between conductive surfaces 1326a and 1328c, conductive surfaces 1326a and 1328b, conductive surfaces 1326b and 1328c, conductive surfaces 1326c and 1328a, conductive surfaces 1326b and 1328a, and conductive surfaces 1326c and 1328b.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention, as defined in the appended claims.

What is claimed is:

1. A spark gap for protecting electronic circuits from excessive electrical surges, comprising:
   a substrate containing an opening, the opening extending at least partially through said substrate and being defined by first and second opposing sides;
   a dielectric medium substantially occupying the opening;
   a first electrode, substantially embedded in said substrate on the first side of the opening, including a first plated hole extending at least partially through said substrate, the first plated hole having a first conductive surface substantially exposed in the opening and to said dielectric medium; and
   a second electrode, substantially embedded in said substrate on the second side of the opening, having a second conductive surface that extends at least partially through said substrate and is substantially exposed in the opening and to said dielectric medium,
   the first conductive surface being in opposing relation to the second conductive surface and being spaced apart from each other by a predetermined distance,
   whereby an electrical arc is generated across the opening, from one of the conductive surfaces to the other one of the conductive surfaces, when an electric potential exceeding a threshold value develops between the conductive surfaces.

2. The spark gap of claim 1, wherein said dielectric medium is air.

3. The spark gap of claim 1, wherein said dielectric medium is alumina.

4. The spark gap of claim 1, wherein said second electrode includes a second plated hole extending at least partially through said substrate, the second plated hole having an exterior that includes the second conductive surface of said second electrode.

5. The spark gap of claim 4, wherein said first electrode includes a first conductive trace situated on said substrate and being in electrical communication with the first conductive surface, and wherein said second electrode includes a second conductive trace situated on said substrate and being in electrical communication with the second conductive surface.

6. The spark gap of claim 4, wherein said substrate includes first and second major surfaces, the first and the second plated holes extending completely through said substrate from the first major surface to the second major surface.

7. The spark gap of claim 6, wherein the opening extends completely through said substrate from the first major surface to the second major surface.

8. The spark gap of claim 7, wherein said first electrode includes a first conductive trace situated on said substrate and being in electrical communication with the first conductive surface, and wherein said second electrode includes a second conductive trace situated on said substrate and being in electrical communication with the second conductive surface.

9. The spark gap of claim 8, wherein said first electrode further includes a third conductive trace in electrical communication with the first conductive surface, the first conductive trace being situated on the first major surface of said substrate and the third conductive trace being situated on the second major surface of said substrate.

10. The spark gap of claim 9, wherein said second electrode further includes a fourth conductive trace in electrical communication with the second conductive surface, the second conductive trace being situated on the first major surface of said substrate and the fourth conductive trace being situated on the second major surface of said substrate.

11. A printed circuit board, comprising:
a substrate including first and second mounting surfaces;
a plurality of conductive traces situated on said substrate, said plurality of conductive traces including a first signal trace and a first ground trace;
a first electrode, substantially embedded in said substrate and in electrical communication with the first signal trace, having a first conductive surface extending at least partially through said substrate from one of the mounting surfaces toward the other one of the mounting surfaces; and
a second electrode, substantially embedded in said substrate and in electrical communication with the first ground trace, having a second conductive surface extending at least partially through said substrate from one of the mounting surfaces toward the other one of the mounting surfaces,
the first conductive surface being in opposing relation with the second conductive surface and being spaced apart from each other by a predetermined distance to form a first spark gap,
whereby an electrical arc is generated across the first spark gap, from one of the conductive surfaces to the other one of the conductive surfaces, when an electric potential exceeding a first threshold value develops between the first and the second conductive surfaces.

12. The printed circuit board of claim 11, further comprising:
a plurality of electronic components mounted to at least some of said plurality of conductive traces and being electrically coupled together to form an electronic circuit, the circuit being in electrical communication with the first signal trace and the first ground trace.

13. The printed circuit board of claim 12, further comprising:
an input signal conductor and an output signal conductor, each mounted to said substrate and in electrical communication with the electronic circuit.

14. The printed circuit board of claim 11, wherein said substrate contains an opening extending at least partially through said substrate and being located between the first and the second conductive surfaces, such that the first spark gap includes the opening, and wherein the opening contains a dielectric medium, the first and the second conductive surfaces being exposed in the opening and to the dielectric medium.

15. The printed circuit board of claim 14, wherein the opening extends through said substrate from the first mounting surface to the second mounting surface.

16. The printed circuit board of claim 11, wherein said substrate is composed substantially of alumina.

17. The printed circuit board of claim 11, wherein said first electrode includes a plated hole extending at least partially through said substrate from the first mounting surface towards the second mounting surface, the plated hole having an exterior that includes the first conductive surface of said first electrode.

18. The printed circuit board of claim 17, wherein said second electrode includes a plated hole extending at least partially through said substrate from the second mounting surface towards the first mounting surface, the plated hole having an exterior that includes the second conductive surface of said second electrode.

19. The printed circuit board of claim 17, wherein said second electrode includes a plated hole having an exterior that includes the second conductive surface of said second electrode, the plated holes of said first and said second electrodes extending through said substrate from the first mounting surface to the second mounting surface.

20. The printed circuit board of claim 17, wherein said second electrode includes a plated hole having an exterior that includes the second conductive surface of said second electrode, the plated holes of said first and said second electrodes extending through said substrate from the first mounting surface to the second mounting surface, and wherein the first and the second conductive surfaces of said first and said second electrodes, respectively, extend through said substrate from the first mounting surface to the second mounting surface.

21. The printed circuit board of claim 17, wherein:
said second electrode includes a plated hole having an exterior that includes the second conductive surface of said second electrode, the plated holes of said first and said second electrodes extending through said substrate from the first mounting surface to the second mounting surface;
the first and the second conductive surfaces of said first and said second electrodes, respectively, extend through said substrate from the first mounting surface to the second mounting surface; and
said substrate contains an opening extending through said substrate from the first mounting surface to the second mounting surface and being located between the first and the second conductive surfaces, such that the first spark gap includes the opening, the opening containing a dielectric medium, the first and the second conductive surfaces being exposed in the opening and to the dielectric medium.

22. The printed circuit board of claim 17, wherein the plated hole of said first electrode extends completely through said substrate from the first mounting surface to the second mounting surface.

23. The printed circuit board of claim 17, wherein the plated hole of said first electrode extends completely through said substrate from the first mounting surface to the second mounting surface, and wherein the first conductive surface of said first electrode extends completely through said substrate from the first mounting surface to the second mounting surface.

24. The printed circuit board of claim 17, wherein said second electrode includes a plated hole extending at least partially through said substrate from the first mounting surface towards the second mounting surface, the plated hole of said second electrode having an exterior that includes the second conductive surface of said second electrode.

25. The printed circuit board of claim 24, wherein said substrate contains an opening extending at least partially through said substrate and being located between the first and the second conductive surfaces, such that the first spark gap includes the opening, the opening containing a dielectric medium.

26. The printed circuit board of claim 24, wherein the plated holes of said first and said second electrodes extend through said substrate from the first mounting surface to the second mounting surface.

27. The printed circuit board of claim 26, wherein the first and the second conductive surfaces of said first and said second electrodes, respectively, each extend through said substrate from the first mounting surface to the second mounting surface.

28. The printed circuit board of claim 27, further comprising a first auxiliary plated hole extending through said substrate from the first mounting surface to the second mounting surface, said first auxiliary plated hole being proximate to and in electrical communication with the plated hole of said first electrode.

29. The printed circuit board of claim 27, further comprising first and second auxiliary plated holes, each extending through said substrate from the first mounting surface to the second mounting surface, said first auxiliary plated hole being proximate to and in electrical communication with the plated hole of said first electrode, and said second auxiliary plated hole being proximate to and in electrical communication with the plated hole of said second electrode.

30. The printed circuit board of claim 27, wherein said substrate contains an opening extending through said substrate from the first mounting surface to the second mounting surface and being located between the first and the second conductive surfaces, such that the first spark gap includes the opening, the opening containing a dielectric medium, and the first and the second conductive surfaces being exposed in the opening and to the dielectric medium.

31. The printed circuit board of claim 27, further comprising a second conductive signal trace, the first signal trace being situated on the first mounting surface of said substrate and the second signal trace being situated on the second mounting surface of said substrate, the plated hole of said first electrode being connected to the first and the second signal traces.

32. The printed circuit board of claim 31, further comprising a second conductive ground trace, the first ground trace being situated on the first mounting surface of said substrate and the second ground trace being situated on the second mounting surface of said substrate, the plated hole of said second electrode being connected to the first and the second ground traces.

33. The printed circuit board of claim 11, wherein:
said first electrode includes a first conductive plated hole section extending at least partially through said substrate from the first mounting surface towards the second mounting surface, the first plated hole section including the first conductive surface of said first electrode;
said second electrode includes a second conductive plated hole section extending at least partially through said substrate from the first mounting surface towards the second mounting surface, the second plated hole section including the second conductive surface of said second electrode; and
said substrate contains an opening extending at least partially through said substrate and being located between the first and the second conductive surfaces, such that the first spark gap includes the opening, the opening containing a dielectric medium, the first plated hole section being substantially electrically isolated from the second plated hole section by the opening and the dielectric medium.

34. The printed circuit board of claim 33, wherein the first and the second plated hole sections extend through said substrate from the first mounting surface to the second mounting surface.

35. The printed circuit board of claim 34, wherein the opening extends through said substrate from the first mounting surface to the second mounting surface; and wherein the first and the second conductive surfaces of said first and said second electrodes, respectively, each extend through said substrate from the first mounting surface to the second mounting surface, the first and the second conductive surfaces being exposed in the opening and to the dielectric medium.

36. The printed circuit board of claim 11, further comprising:
a second conductive signal trace situated on said substrate;
a third electrode, substantially embedded in said substrate and in electrical communication with the second signal trace, having a third conductive surface that extends at least partially through said substrate from one of the mounting surfaces toward the other one of the mounting surfaces; and
a fourth electrode, substantially embedded in said substrate and in electrical communication with the first ground trace, having a fourth conductive surface that extends at least partially through said substrate from one of the mounting surfaces toward the other one of the mounting surfaces,
the third conductive surface being in opposing relation with the fourth conductive surface and being spaced apart from each other by a predetermined distance to form a second spark gap,
whereby an electrical arc is generated across the second spark gap, from one of the third and fourth conductive surfaces to the other one of the third and fourth conductive surfaces, when an electric potential exceeding a second threshold value develops between the third and the fourth conductive surfaces.

37. The printed circuit board of claim 36, wherein the first threshold value is about the same value as the second threshold value.

38. The printed circuit board of claim 36, wherein:
said third electrode includes a third plated hole extending through said substrate from the first mounting surface to the second mounting surface, the third plated hole having an exterior that includes the third conductive surface of said third electrode;
said fourth electrode includes a fourth plated hole extending through said substrate from the first mounting surface to the second mounting surface, the fourth plated hole having an exterior that includes the fourth conductive surface of said fourth electrode; and
said substrate contains an opening extending through said substrate and being located between the third and the fourth conductive surfaces, such that the second spark gap includes the opening, the opening containing a dielectric medium, and the third and the fourth conductive surfaces being exposed in the opening and to the dielectric medium.

39. The printed circuit board of claim 38, wherein the third and the fourth conductive surfaces of said third and said fourth electrodes, respectively, each extend through said substrate from the first mounting surface to the second mounting surface.

40. The printed circuit board of claim 11, further comprising:
a second conductive signal trace and a second conductive ground trace, each situated on said substrate;
a third electrode, substantially embedded in said substrate and in electrical communication with the second signal trace, having a third conductive surface that extends at least partially through said substrate from one of the mounting surfaces toward the other one of the mounting surfaces; and a fourth electrode, substantially embedded in said substrate and in electrical communication with the second ground trace, having a fourth conductive surface that extends at least partially through said substrate from one of the mounting surfaces toward the other one of the mounting surfaces, the third conductive surface being in opposing relation with the fourth conductive surface and being spaced apart from each other by a predetermined distance to form a second spark gap, whereby an electrical arc is generated across the second spark gap, from one of the third and fourth conductive surfaces to the other one of the third and fourth conductive surfaces, when an electric potential exceeding a second threshold value develops between the third and the fourth conductive surfaces.

41. The printed circuit board of claim 40, wherein:

said third electrode includes a third plated hole extending through said substrate from the first mounting surface to the second mounting surface, the third plated hole having an exterior that includes the third conductive surface of said third electrode;

said fourth electrode includes a fourth plated hole extending through said substrate from the first mounting surface to the second mounting surface, the fourth plated hole having an exterior that includes the fourth conductive surface of said fourth electrode; and said substrate contains an opening extending through said substrate and being located between the third and the fourth conductive surfaces, such that the second spark gap includes the opening, the opening containing a dielectric medium, and the third and the fourth conductive surfaces being exposed in the opening and to the dielectric medium.

42. The printed circuit board of claim 11, wherein said first electrode includes a first conductive filled hole extending at least partially through said substrate, the first filled hole having an exterior that includes the first conductive surface of said first electrode.

43. The printed circuit board of claim 42, wherein said second electrode includes a second conductive filled hole extending at least partially through said substrate, the second filled hole having an exterior that includes the second conductive surface of said second electrode.

44. An electronic filter apparatus with electric surge protection, comprising:

a printed circuit board having first and second mounting surfaces and a plurality of conductive traces, said plurality of conductive traces including a first signal trace and a first ground trace, said printed circuit board containing an opening proximate to the first signal trace and the first ground trace, the opening extending at least partially through said printed circuit board from one of the mounting surfaces toward the other one of the mounting surfaces and being defined by first and second opposing sides, the opening containing a dielectric medium;

a plurality of electronic components mounted to at least some of the plurality of conductive traces and being electrically coupled together to form an electronic filter circuit, the filter circuit being in electrical communication with the first signal trace and the first ground trace;

an input conductor and an output conductor, each mounted to said printed circuit board and in electrical communication with the filter circuit, such that said input conductor is able to deliver a signal to be filtered to the filter circuit and said output conductor is able to carry away a signal filtered by the filter circuit;

a first electrode, in electrical communication with the first signal trace and substantially embedded in said printed circuit board on the first side of the opening, having a first conductive surface extending at least partially through said printed circuit board from one of the mounting surfaces toward the other one of the mounting surfaces, the first conductive surface being at least partially exposed in the opening and to said dielectric medium; and a second electrode, in electrical communication with the first ground trace and substantially embedded in said printed circuit board on the second side of the opening, having a second conductive surface extending at least partially through said printed circuit board from one of the mounting surfaces toward the other one of the mounting surfaces, the second conductive surface being at least partially exposed in the opening and to said dielectric medium, the first conductive surface being in opposing relation with the second conductive surface and being spaced apart from each other by a predetermined distance to form a first spark gap, whereby an electrical arc is generated across the opening, from one of the conductive surfaces to the other one of the conductive surfaces, when an electric potential exceeding a first threshold value develops between the first and the second conductive surfaces.

45. The electronic filter of claim 44, wherein said first and said second electrodes extend through said printed circuit board from the first mounting surface to the second mounting surface.

46. The electronic filter of claim 44, wherein the opening of said printed circuit board extends through said printed circuit board from the first mounting surface to the second mounting surface.

47. The electronic filter of claim 44, wherein:

said first electrode includes a first plated hole extending through said printed circuit board between the first and the second mounting surfaces, the first plated hole having an exterior that includes the first conductive surface of said first electrode; and said second electrode includes a second plated hole extending through said printed circuit board between the first and the second mounting surfaces, the second plated hole having an exterior that includes the second conductive surface of said second electrode.

48. The electronic filter of claim 47, wherein the opening of said printed circuit board extends through said printed circuit board between the first and the second mounting surfaces.

49. The electronic filter of claim 44, wherein:

said first electrode includes a first conductive plated hole section extending through said printed circuit board between the first and the second mounting surfaces, the first plated hole section including the first conductive surface of said first electrode; and said second electrode includes a second conductive plated hole section extending through said printed circuit board between the first and the second mounting surfaces, the second plated hole section including the second conductive surface of said second electrode; and the opening of said printed circuit board extends through said printed circuit board between the first and the second mounting surfaces.

50. A spark gap for protecting electronic circuits from excessive electrical surges, comprising:
a substrate containing an opening, the opening extending through said substrate and being defined by first and second opposing sides;
a dielectric medium substantially occupying the opening;
a first plated hole section located on the first side of the opening and extending through said substrate, said first plated hole section having a first conductive surface that is substantially exposed in the opening and to said dielectric medium;
a first auxiliary plated hole proximate said first plated hole section and extending through said substrate;
a first conductive area situated on said substrate and connected to said first plated hole section and said first auxiliary plated hole, such that said first plated hole section is in electrical communication with said first auxiliary plated hole; and
a second plated hole section located on the second side of the opening and extending through said substrate, said second plated hole section having a second conductive surface that is substantially exposed in the opening and to said dielectric medium,
the first conductive surface of said first plated hole section being in opposing relation to the second conductive surface of said second plated hole section and being spaced apart from each other by a predetermined distance,
whereby an electrical arc is generated across the opening, from one of the conductive surfaces to the other one of the conductive surfaces, when an electric potential exceeding a threshold value develops between the conductive surfaces.

51. The spark gap of claim 50, further comprising:
a second auxiliary plated hole proximate said second plated hole section and extending through said substrate; and
a second conductive area situated on said substrate and connected to said second plated hole section and said second auxiliary plated hole, such that said second plated hole section is in electrical communication with said second auxiliary plated hole.

52. A spark gap for protecting electronic circuits from excessive electrical surges, comprising:
a substrate containing an opening, the opening extending through said substrate and being defined by first and second opposing sides;
a dielectric medium substantially occupying the opening;
a first plated hole located on the first side of the opening and extending through said substrate, said first plated hole having a first conductive surface that is substantially exposed in the opening and to said dielectric medium; and
a second plated hole located on the second side of the opening and extending through said substrate, said second plated hole having a second conductive surface that is substantially exposed in the opening and to said dielectric medium,
the first conductive surface being in opposing relation to the second conductive surface and being spaced apart from each other by a predetermined distance,
whereby an electrical arc is generated across the opening, from one of the conductive surfaces to the other one of the conductive surfaces, when an electric potential exceeding a threshold value develops between the conductive surfaces.

53. The spark gap of claim 52, further comprising:
a first auxiliary plated hole proximate said first plated hole and extending through said substrate; and
a first conductive area situated on said substrate and connected to said first plated hole and said first auxiliary plated hole, such that said first plated hole is in electrical communication with said first auxiliary plated hole.

54. The spark gap of claim 53, further comprising:
a second auxiliary plated hole proximate said second plated hole and extending through said substrate; and
a second conductive area situated on said substrate and connected to said second plated hole and said second auxiliary plated hole, such that said second plated hole is in electrical communication with said second auxiliary plated hole.

55. A spark gap for protecting electronic circuits from excessive electrical surges, comprising:
a substrate containing an opening, the opening extending at least partially through said substrate and being defined by first and second opposing sides;
a dielectric medium substantially occupying the opening;
a first electrode, substantially embedded in said substrate on the first side of the opening, including a first plated hole section extending at least partially through said substrate, the first plated hole section having a first conductive surface that is substantially exposed in the opening and to said dielectric medium; and
a second electrode, substantially embedded in said substrate on the second side of the opening, having a second conductive surface that extends at least partially through said substrate and is substantially exposed in the opening and to said dielectric medium,
the first conductive surface being in opposing relation to the second conductive surface and being spaced apart from each other by a predetermined distance,
whereby an electrical arc is generated across the opening, from one of the conductive surfaces to the other one of the conductive surfaces, when an electric potential exceeding a threshold value develops between the conductive surfaces.

56. The spark gap of claim 55, wherein said second electrode includes a second plated hole section extending at least partially through said substrate, the second conductive surface of said second electrode being a part of the second plated hole section, the first plated hole section being electrically isolated from the second plated hole section by the opening and the dielectric medium.

57. The spark gap of claim 56, wherein said first electrode includes a first conductive trace situated on said substrate and being in electrical communication with the first conductive surface, and wherein said second electrode includes a second conductive trace situated on said substrate and being in electrical communication with the second conductive surface.

58. The spark gap of claim 56, wherein said substrate includes first and second major surfaces, the first and the second plated holes hole sections extending completely through said substrate from the first major surface to the second major surface.

59. The spark gap of claim 58, wherein the opening extends completely through said substrate from the first major surface to the second major surface.

60. The spark gap of claim 59, wherein said first electrode includes a first conductive trace situated on said substrate and being in electrical communication with the first conductive surface, and wherein said second electrode includes a second conductive trace situated on said substrate and being in electrical communication with the second conductive surface.

61. The spark gap of claim 60, wherein said first electrode further includes a third conductive trace in electrical communication with the first conductive surface, the first conductive trace being situated on the first major surface of said substrate and the third conductive trace being situated on the second major surface of said substrate.

62. The spark gap of claim 61, wherein said second electrode further includes a fourth conductive trace in electrical communication with the second conductive surface, the second trace being situated on the first major surface of said substrate and the fourth trace being situated on the second major surface of said substrate.

63. A spark gap for protecting electronic circuits from excessive electrical surges, comprising:

a substrate containing an opening, the opening extending at least partially through said substrate and being defined by first and second opposing sides;

a dielectric medium substantially occupying the opening;

a first electrode, substantially embedded in said substrate on the first side of the opening, including a first conductive filled hole extending at least partially through said substrate, the first filled hole having a first conductive surface that is substantially exposed in the opening and to said dielectric medium; and a second electrode, substantially embedded in said substrate on the second side of the opening, having a second conductive surface that extends at least partially through said substrate and is substantially exposed in the opening and to said dielectric medium, the first conductive surface being in opposing relation to the second conductive surface and being spaced apart from each other by a predetermined distance, whereby an electrical arc is generated across the opening, from one of the conductive surfaces to the other one of the conductive surfaces, when an electric potential exceeding a threshold value develops between the conductive surfaces.

64. The spark gap of claim 63, wherein said second electrode includes a second conductive filled hole extending at least partially through said substrate, the second filled hole having an exterior that includes the second conductive surface of said second electrode.

* * * * *